US012568794B2

(12) United States Patent
Dunlope et al.

(10) Patent No.: US 12,568,794 B2
(45) Date of Patent: Mar. 3, 2026

(54) SEMICONDUCTOR SUBSTRATE CARRYING CONTAINER WITH SUPPORT WALL FORMED WITH CORRUGATION PORTIONS

(71) Applicant: ENTEGRIS, INC., Billerica, MA (US)

(72) Inventors: Jack Dunlope, Colorado Springs, CO (US); Christopher Strickhouser, Monument, CO (US); Matthew A. Fuller, Colorado Springs, CO (US); Colton J. Harr, Monument, CO (US)

(73) Assignee: ENTEGRIS, INC., Billerica, MA (US)

( * ) Notice: Subject to any disclaimer, the term of this patent is extended or adjusted under 35 U.S.C. 154(b) by 65 days.

(21) Appl. No.: 18/387,734

(22) Filed: Nov. 7, 2023

(65) Prior Publication Data

US 2024/0162068 A1      May 16, 2024

Related U.S. Application Data

(60) Provisional application No. 63/425,244, filed on Nov. 14, 2022.

(51) Int. Cl.
*H01L 21/673* (2006.01)
*H01L 21/687* (2006.01)

(52) U.S. Cl.
CPC .... *H01L 21/67326* (2013.01); *H01L 21/6732* (2013.01); *H01L 21/6875* (2013.01); *H01L 21/68785* (2013.01)

(58) Field of Classification Search
CPC ......... H01L 21/67383; H01L 21/67369; H01L 21/67386; H01L 21/67379; H01L 21/67393; H01L 21/67373; H01L 21/67389; H01L 21/6732; H01L 21/67376

USPC ................................. 206/711, 710, 454, 832
See application file for complete search history.

(56) References Cited

U.S. PATENT DOCUMENTS

| | | | | |
|---|---|---|---|---|
| 5,788,082 | A * | 8/1998 | Nyseth ................. | E21B 11/005 206/711 |
| 7,121,414 | B2 * | 10/2006 | Beckhart ............. | H01L 21/6732 211/41.18 |
| 8,387,799 | B2 * | 3/2013 | Chiu ................. | H01L 21/67389 206/711 |
| 10,535,540 | B2 * | 1/2020 | Kanamori ......... | H01L 21/67366 |
| 2015/0129459 | A1 | 5/2015 | Fuller et al. | |
| 2019/0080946 | A1 | 3/2019 | Eguchi | |
| 2019/0139792 | A1 | 5/2019 | Liu et al. | |
| 2021/0028039 | A1 | 1/2021 | Tindel et al. | |
| 2022/0293446 | A1 | 9/2022 | Fuller et al. | |

FOREIGN PATENT DOCUMENTS

| | | |
|---|---|---|
| JP | 2008141106 A | 6/2008 |
| JP | 2013038200 A | 2/2013 |
| TW | M539495 U | 4/2017 |

* cited by examiner

*Primary Examiner* — King M Chu

(57)      ABSTRACT

A semiconductor substrate carrying container, such as a front opening unified pod or shipping box, that includes a container shell having a plurality of walls, a front, and a rear, the plurality of walls defining an interior space that is sized to be able to receive a plurality of semiconductor substrates or trays, and a support structure configured to receive the plurality of semiconductor substrates or trays. The support structure includes at least one support wall that is formed by a plurality of corrugation portions provided along opposite sides of a centerline along a vertical plane at a center of the at least one support wall.

15 Claims, 19 Drawing Sheets

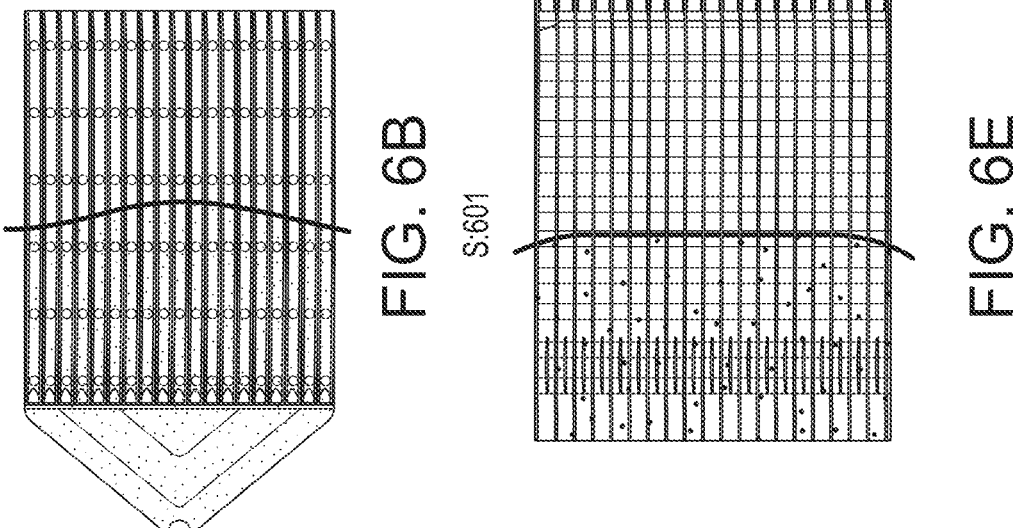
FIG. 6B
FIG. 6E
S:601
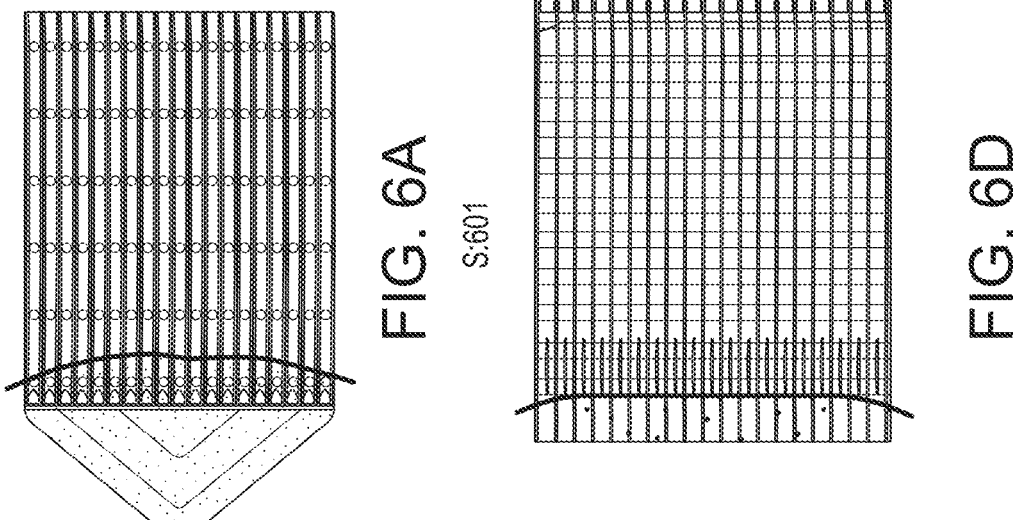
FIG. 6A
FIG. 6D
S:601

S.603

SEMICONDUCTOR SUBSTRATE CARRYING CONTAINER WITH SUPPORT WALL FORMED WITH CORRUGATION PORTIONS

FIELD

This disclosure relates generally to semiconductor substrate carrying containers such as front opening unified pods (FOUPs) or front opening shipping boxes (FOSBs), for example those used in semiconductor manufacturing. More specifically, the disclosure relates to semiconductor substrate carrying containers that have a wall formed with corrugation portions, and methods for producing the wall with corrugation portions.

BACKGROUND

Substrate carrying containers are used to transport substrates during semiconductor manufacturing. Substrate carrying containers include, for example, FOUPs or FOSBs. FOUPs and FOSBs typically include a shell which provides an internal space and supports for holding substrates or trays, and a plate that is used to interface with various conveyors and other devices, for example so that the FOUP or FOSBs can be moved around the processing facility. A FOUP or FOSB typically includes a front opening through which a substrate or tray can be removed and inserted into the container.

SUMMARY

This disclosure generally relates to semiconductor substrate carrying containers such as front opening unified pods (FOUPs) or front opening shipping boxes (FOSBs), for example those used in semiconductor manufacturing. More specifically, the disclosure relates to semiconductor substrate carrying containers that have a wall formed with corrugation portions, and methods for producing the wall with corrugation portions.

Semiconductor substrate carrying containers, such as FOUPs or FOSBs, are described herein where a semiconductor substrate can be accessed and removed from or inserted into an interior space of the container via a front opening. The semiconductor substrates can be any substrates used in semiconductor manufacturing. Examples of the semiconductor substrates that can be located in the containers described herein can include, but are not limited to, wafers and panels (such as flat panels), and combinations thereof.

In prior designs of such semiconductor substrate carrying containers, substrate supports can be provided in the interior of the semiconductor substrate carrying containers. The substrate supports can also include a flat plate with extending ribs for transporting semiconductor substrates. The flat geometry of the flat plate allows the substrate support to fit inside the semiconductor substrate carrying container while also providing support features of the semiconductor substrate that is to be transported. In view of the prior design of the substrate supports, the semiconductor substrate carrying containers can have a weight that is not compatible with overhead transport (OHT) equipment, e.g., a system that can include any one of conveyors, tracks, hoists, or lifts. For example, the OHT equipment that can be used to transport the semiconductor substrate carrying containers in a facility for semiconductor processing can be weight limited, e.g., having a maximum load capacity of 30-50 pounds. As such, OHT equipment may not be used when the semiconductor substrate carrying containers are too heavy, e.g., exceed the load capacity, due in part to weight of the flat plate and ribs having a thickness between 3 mm and 4 mm to support the semiconductor substrates. Instead, the semiconductor substrate carrying container can be transported manually throughout the facility.

Embodiments disclosed herein can provide solutions to the above problems by e.g., reducing the overall mass of the semiconductor substrate carrying containers, providing rigid support for semiconductor substrates and trays, in which the walls used in the semiconductor substrate carrying container have improved internal stress or warp, e.g., decreased values, of the substrate supports over the POR designs.

In an embodiment, a semiconductor substrate carrying container as described herein can include a container shell having a plurality of walls, a front, and a rear, where the plurality of walls defines an interior space that is sized to be able to receive a plurality of semiconductor substrates or trays therein. The semiconductor substrate carrying container can also include a support structure configured to receive the plurality of semiconductor substrates or trays. The container shell defines an opening configured to allow a semiconductor substrate or tray of the plurality of semiconductor substrates and trays to be inserted into or removed from the interior space. In addition, the support structure includes at least one support wall that is formed by a plurality of corrugation portions provided along opposite sides of a centerline along a vertical plane at a center of the at least one support wall.

In another embodiment, a front opening shipping box (FOSB) or unified pod (FOUP) described herein can include a shell having a front opening and an interior space. The FOSB or FOUP can include a support structure that includes a plurality of pairs of opposing support ledges within the interior space and attached to the shell, in which each pair of opposing support ledges is configured to support a semiconductor substrate or tray in the interior space. At least one of the opposing support ledges includes a support wall formed with a plurality of corrugation portions provided along opposite sides of a centerline along a vertical plane at a center of the support wall.

In still another embodiment, a method for manufacturing a substrate carrying container as described herein can include the steps of filling a resin over a mold for at least one wall of a plurality of walls for a container shell for the substrate carrying container such that a flow of the resin has a flow rate for forming the wall that is about a same flow rate for forming a support ledge extending from the wall. In addition, the mold for the at least one wall includes a plurality of corrugation portions provided along opposite sides of a centerline along a vertical plane at a center of the at least one wall, in which at least one corrugation portion of the plurality of corrugation portions creates a uniform flow front such that the flow rate of the resin is about the same for forming the wall and the support ledge.

DRAWINGS

References are made to the accompanying drawings that form a part of this disclosure and which illustrate the embodiments in which systems and methods described in this specification can be practiced.

FIGS. 6A-6F illustrate comparative methods of manufacturing a support structure, according to an embodiment.

Like reference numbers represent like parts throughout.

DETAILED DESCRIPTION

Figure 1A:
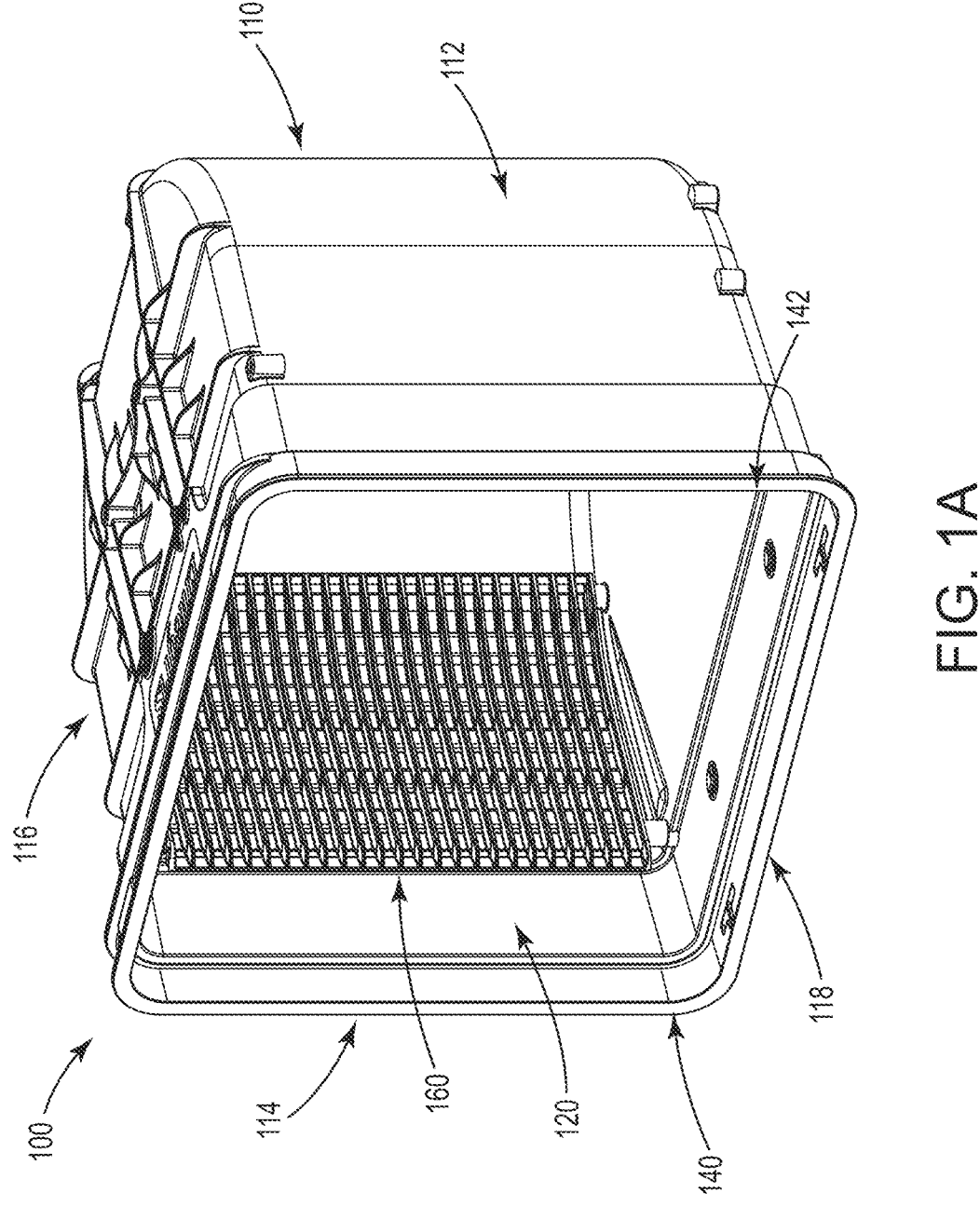
FIG. 1A is a perspective view of a semiconductor substrate carrying container, according to an embodiment.
Figure 1B:
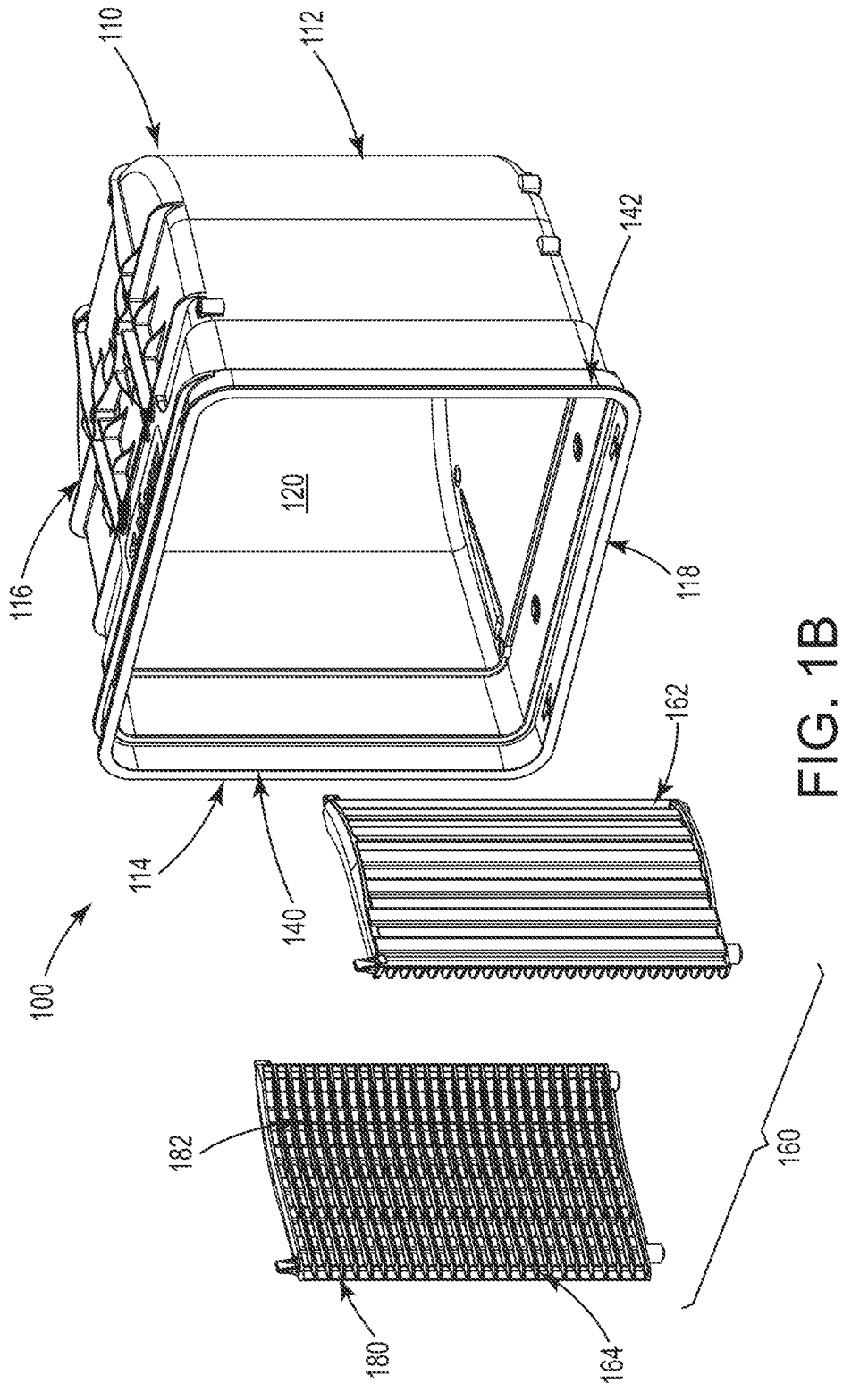
FIG. 1B is a perspective exploded view of a semiconductor substrate carrying container, according to the embodiment of FIG. 1A.

This disclosure generally relates to semiconductor substrate carrying containers such as front opening unified pods (FOUPs) or front opening shipping boxes (FOSB s), for example those used in semiconductor manufacturing. More specifically, the disclosure relates to semiconductor substrate carrying containers that have a wall formed with corrugation portions, and methods for producing the wall with corrugation portions.

Embodiments disclosed herein can provide solutions to the above problems by e.g., reducing the overall mass of the semiconductor substrate carrying containers, providing rigid support for semiconductor substrates and trays, in which the walls used in the semiconductor substrate carrying container have improved internal stress or warp, e.g., decreased values, of the substrate supports over the POR designs. For example, in an embodiment, the overall mass of the semiconductor substrate carrying containers can be reduced by about 30-65% over prior process or product of record (POR) designs by using walls formed with corrugation portions instead of being formed with flat plate walls to reduce the overall thickness of the substrate supports walls. Additionally, in an embodiment, the wall having the corrugation portions can have an internal stress that is 5 to 10 times lower than the POR designs and a warp that is 2 to 5 times lower than the POR designs, in which the internal stress and warp is more uniform than the POR designs. It was surprisingly found that the use of walls having or formed with the corrugation portions for the substrate support walls not only reduced the mass of the semiconductor substrate carrying container, but also added rigidity and stiffness to the walls and ribs that overcame molded-in stresses and controlled warp while maintaining existing substrate or tray interface points, e.g., plane and width. As such, the support wall with corrugation portions can allow the substrate support to be designed with thin wall sections to reduce mass while still retaining strength characteristics similar to simpler, thick flat plate walls of the POR designs, as discussed further herein.

Particular embodiments of the present disclosure are described herein with reference to the accompanying drawings; however, it is to be understood that the disclosed embodiments are merely examples of the disclosure, which can be embodied in various forms. Well-known functions or constructions are not described in detail to avoid obscuring the present disclosure in unnecessary detail. Therefore, specific structural and functional details disclosed herein are not to be interpreted as limiting, but merely as a basis for the claims and as a representative basis for teaching one skilled in the art to variously employ the present disclosure in virtually any appropriately detailed structure. In this description, as well as in the drawings, like-referenced numbers represent elements that can perform the same, similar, or equivalent functions.

The scope of the disclosure should be determined by the appended claims and their legal equivalents, rather than by the examples given herein. For example, the steps recited in any method claims can be executed in any order and are not limited to the order presented in the claims. Moreover, no element is essential to the practice of the disclosure unless specifically described herein as "critical" or "essential".

With reference to FIGS. 1A-1D, an embodiment of a semiconductor substrate carrying container 100 is illustrated. In one embodiment, the container 100 may be referred to as a FOUP or FOSB. The container 100 includes a container shell 110 having a plurality of walls including a rear wall 111 at a rear of the container shell 110, a first side wall 112, a second side wall 114 opposite the first side wall 112, a top wall 116, and a bottom wall 118 opposite the top wall 116. The walls define an interior space 120 that is sized to be able to receive a plurality of semiconductor substrates or trays 130 therein (for sake of convenience, semiconductor substrates or trays 130 are only visible in FIG. 1C). In one embodiment, the container 100 can be configured to receive and hold twenty-five substrates or trays 130, although the container 100 can be configured to hold a larger or smaller number of substrates or trays 130. The container 100 can further include a front 140 having a front opening 142 through which each one of the semiconductor substrates or trays 130 is able to be removed from and inserted into the interior space 120. In addition, the container 100 can include a machine interface plate (not shown) that can be connected to the bottom wall 118 of the shell 110 and an equipment hookup (not shown) that can be connected to the top wall 116 of the shell 110, which allows a standard automated attachment (not shown) for moving the substrate container 100, such as but not limited to an automated arm or OHT equipment. It is appreciated that while the container 100 is discussed herein as having a front opening, such disclosure is not intended to limit the scope of the disclosure. For example, in an embodiment, the container 100 can include or further includes a rear opening through which one of the semiconductor substrates or trays 130 is able to be removed from and inserted into the interior space 120.

The semiconductor substrates or tray 130 can be any substrates or trays holding the substrates that can be used in semiconductor manufacturing. Examples of the semiconductor substrates or trays 130 that can be located in the containers 100 described herein can include, but are not limited to, wafers, panels (such as flat panels), dies, trays holding the same, and combinations thereof. The embodiment in FIG. 1C depicts the substrates or trays 130 as being wafers.

In an embodiment, the container 100 can include support structure 160 that is provided in the interior space 120 for supporting the semiconductor substrates or trays 130 therein. The support structure can have any configuration that is sufficient to support the semiconductor substrates or trays 130 and that permits the removal and insertion of the semiconductor substrates or trays 130 through the front opening 142. In the illustrated example, the support structure 160 supports the semiconductor substrates or trays 130 in a vertically stacked arrangement where the substrates or trays 130 are vertically spaced from one another and each substrate or tray 130 is oriented horizontally substantially parallel to the top wall 116 and the bottom wall 118.

In the embodiment, the support structure 160 can include a plurality of pairs of opposing support walls 162 having support ledges (referred to generally using 164) within the interior space 120. The opposing support walls 162 can be attached to the opposing side walls 112, 114, the rear wall 111, or to the top wall 116 and the bottom wall 118 of the container shell 110 or combinations thereof using any one of tabs, clips, rods, fasteners, grooves and projections, or the like. When viewing the container 100 from the top, like in FIG. 1C, each pair of opposing support ledges 164 may be referred to as having a right support ledge 164a and a left support ledge 164b. The right and left support ledges 164a, 164b forming each pair of support ledges are configured to support a respective one of the semiconductor substrates or trays 130 in the interior space 120.

Figure 1C:
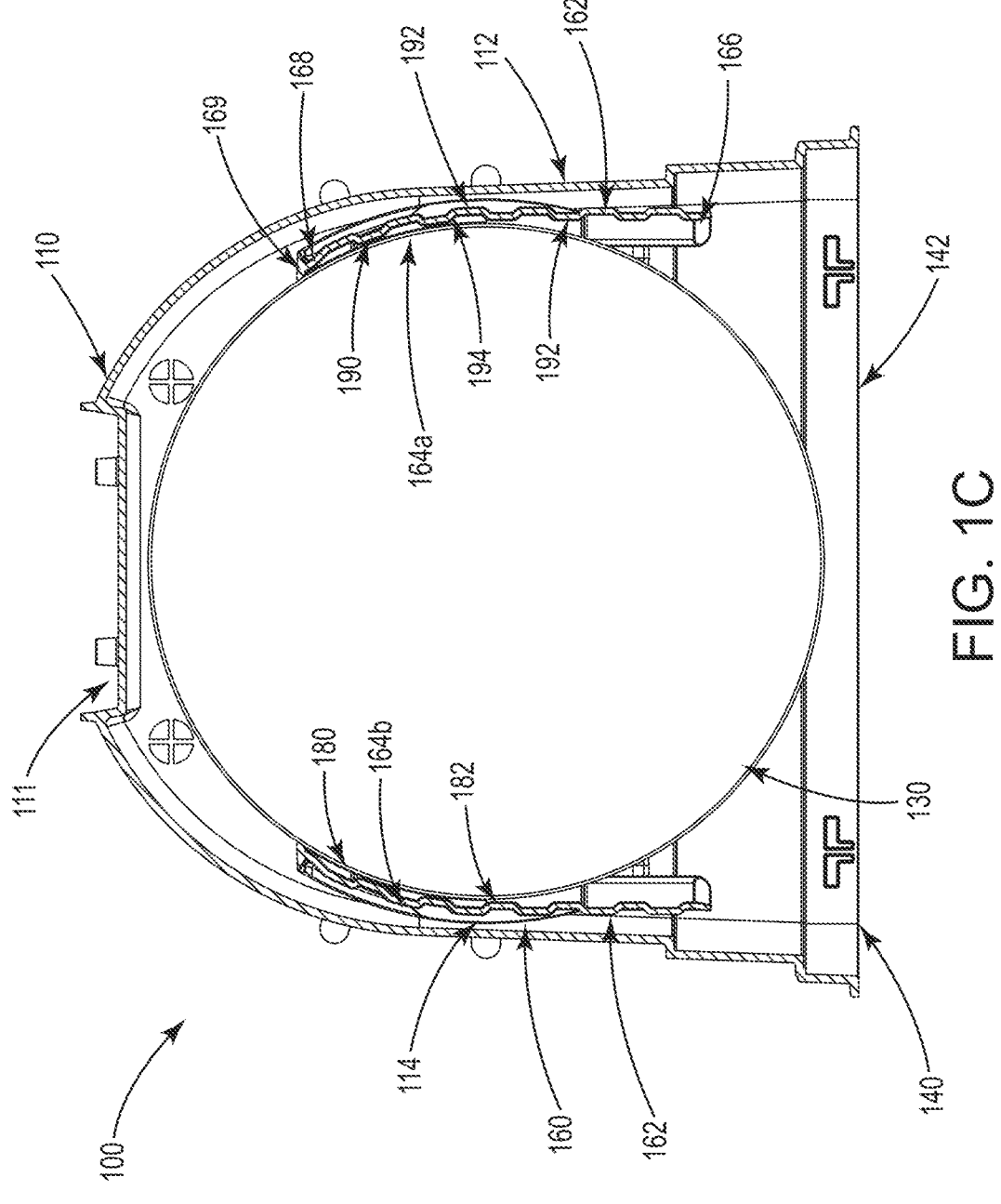
FIG. 1C is a top cross-sectional view of a semiconductor substrate carrying container, according to the embodiment of FIG. 1A.
Figure 1D:
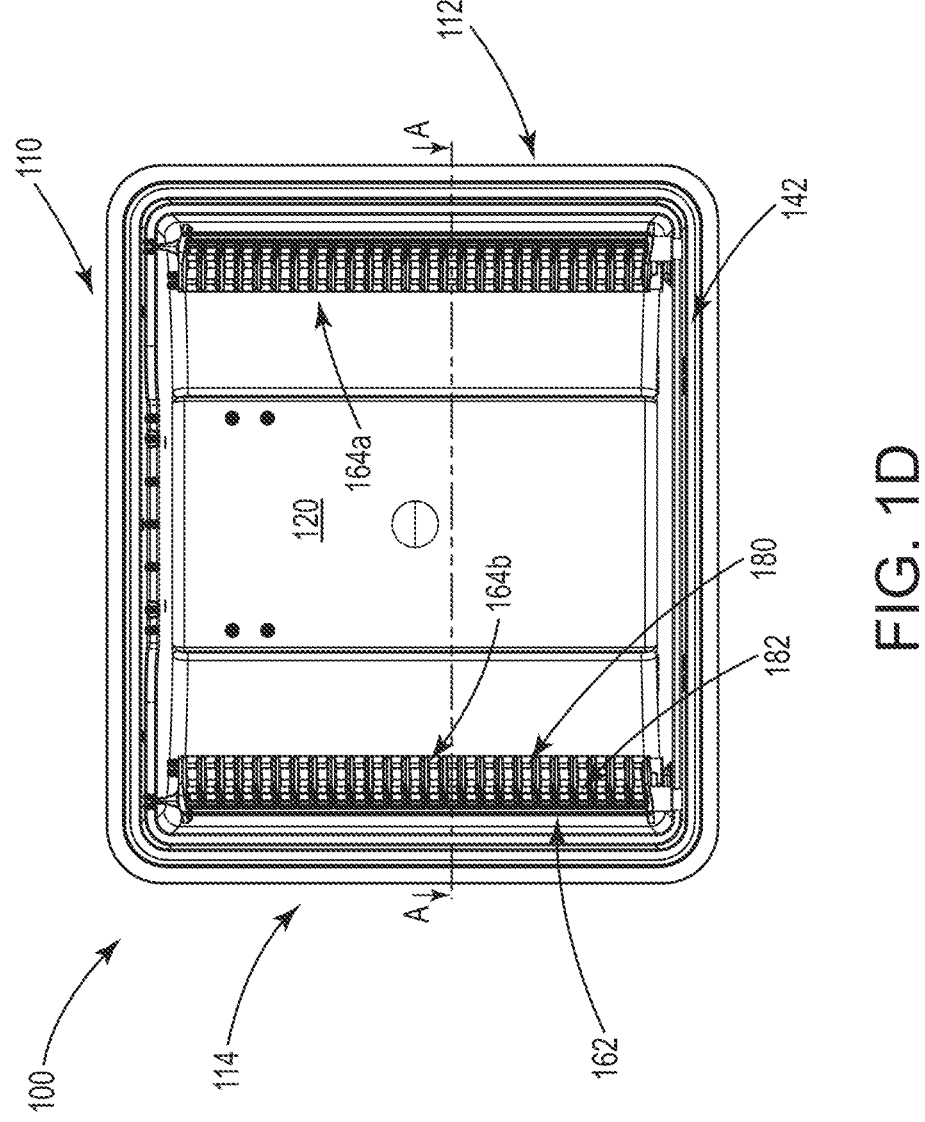
FIG. 1D is a front view of a semiconductor substrate carrying container, according to the embodiment of FIG. 1A.

Referring to FIGS. 1C and 1D, each of the right and left support ledges 164a, 164b can include a front portion 166 located toward the front 140 of the shell 110 and a rear portion 168 located toward the rear wall 111 of the shell 110. The support ledges 164a, 164b are configured to position and support the substrate or trays 130 in an X-Y plane. At least one of the rear portions 168 of the support ledges 164a, 164b, and preferably both of the rear portions 168 of the support ledges 164a, 164b, can include a stop 169 that is engageable with the semiconductor substrate or tray 130 to limit insertion of the semiconductor substrate or tray 130 into the interior space 120 in the Y-direction through the front opening 142.

Each support ledge 164a, 164b can further include a horizontal ledge portion 180 and a vertical ledge portion 182 extending upwardly from the horizontal ledge portion 180. The horizontal ledge portions 180 can be ribs extending perpendicularly from the support walls 162 for supporting the plurality of substrates or trays 130. The vertical ledge portion 182 can be a part of the support walls forming the corrugation portions (as discussed herein) or a part of the horizontal ledge portion 180 that is configured to align the insertion of the substrate or tray 130 onto the horizontal ledge portions 182. In an embodiment, when the semiconductor substrates are used, a plurality of semiconductor substrate positioning pads (not shown) can be disposed on the horizontal ledge portion 180. The positioning pads are protrusions on the horizontal ledge portion 180 that the substrate 130 rests on and that position the substrate 130 in the X-Y plane. Any number of positioning pads can be provided.

In an embodiment, the wall 162 of the support structure 160 can include or be formed with a plurality of corrugation portions 190 provided along opposite sides of a centerline that is along a vertical plane at a center of the wall 162. It is understood that the plurality of corrugation portions 190 includes at least 2 corrugation portions, e.g., each corrugation portion provided on opposite sides of the centerline, and can include any number of corrugation portions, for example, at least 10 corrugation portions or 20 corrugation portions. The number of corrugation portions is dependent on the application and weight requirement of the FOSB or FOUP and the weight of the substrates or trays that need to be supported. Each of the corrugation portions 190 have a inner and outer portions 192 that can be parallel to the centerline and angled portions 194 connecting the inner and outer portions 192 that are provided along opposite sides of the centerline along the vertical plane at a center of the wall

162. The inner and outer portions 192 can be spaced between about 1 and 20 mm from corresponding inner and outer portions 192 provided on opposite sides of the centerline and spaced about 1 to 10 mm from the centerline. In an embodiment, the inner and outer portions 192 can be spaced between about 5 and 10 mm from corresponding inner and outer portions 192 provided on opposite sides of the centerline and spaced about 2.5 to 5 mm from the centerline. The angled portions 194 connecting the corresponding inner and outer portions 192 are connected at angles that are about 30 to 90 degrees with respect to the centerline. The thickness of the wall 162 can be between about 1 mm and 5 mm, which can reduce the weight of the wall 162 by about 20 to 40% over POR designs having a flat plate with the same or similar rigidity and strength, e.g., by having a greater wall thickness. As such, the corrugation portions 190 can be provided on inner and outer sides (with respect to the interior space) of the wall 162 to provide rigidity and strength to the wall 162 while reducing the overall weight of the semiconductor substrate carrying container 100. The inner and outer portions 192 can be dependent on the type of semiconductor equipment inserted into the substrate container 100. For example, in an embodiment, the inner and outer portions 192 can be flat or curved or semi-circular depending on whether a tray or wafer is being inserted into the substrate container 100. While the inner and outer portions 192 are described herein as being flat or curved, such disclosure is not intended to be limited in scope, but rather, descriptive of the inner and outer portions 192 having a geometric shape for accommodating the semiconductor material.

The substrate container 100 and components therein can be formed from one or more polymer materials including, but not limited to, injection-moldable polymer materials. The polymer material(s) can include, but are not limited to, one or more polyolefins, one or more polycarbonate, one or more thermoplastic polymers and the like. In an embodiment, some or all of the substrate container 100 can be injection molded. The one or more polymer materials can form a matrix including carbon fill. In an embodiment, the one or more polymer materials can be selected to minimize particle shedding during handling and use of the substrate container 100.

Figure 2A:
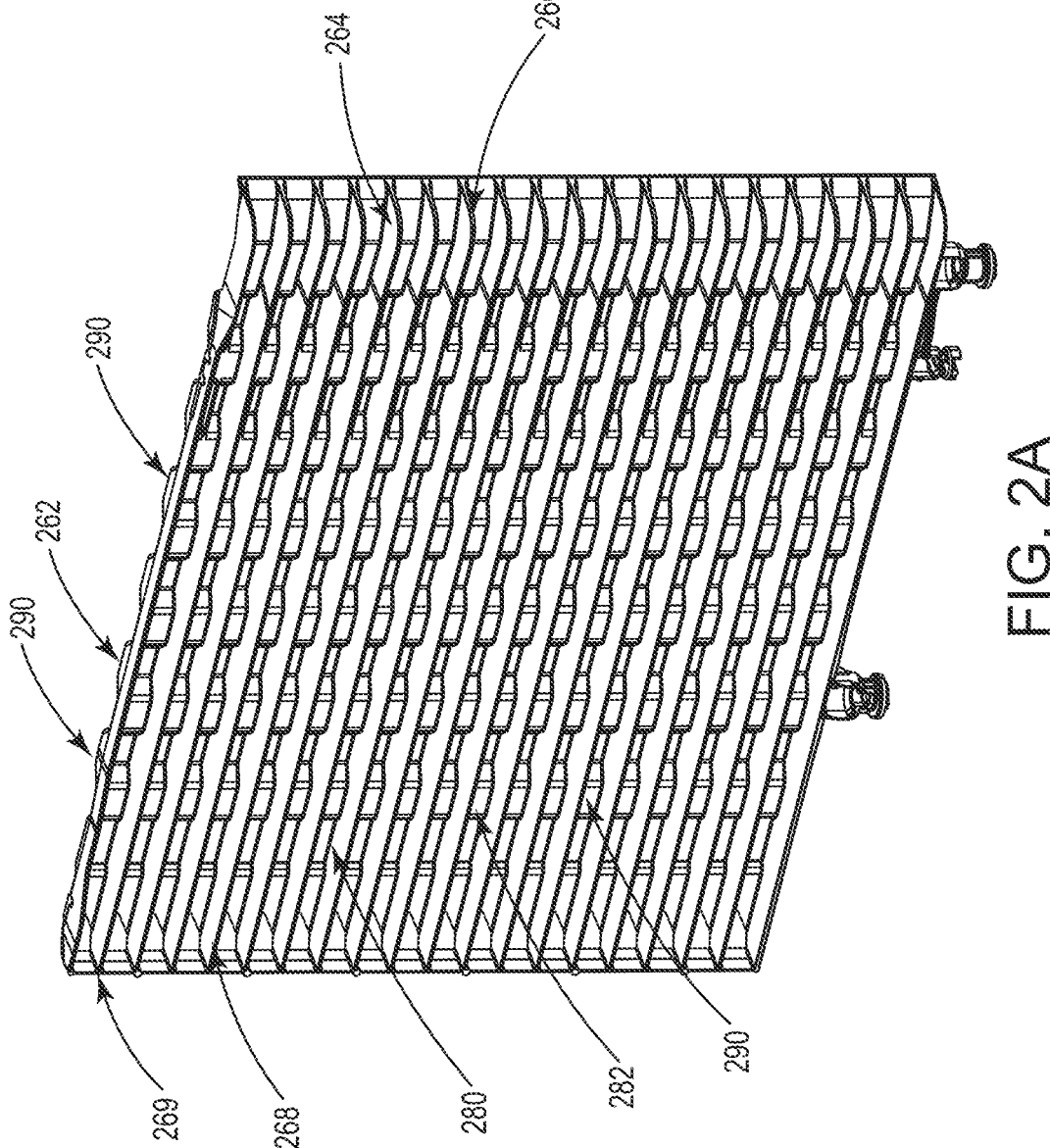
FIGS. 2A-2C illustrate a support wall used in a semiconductor substrate carrying container, according to an embodiment.
Figure 2B:
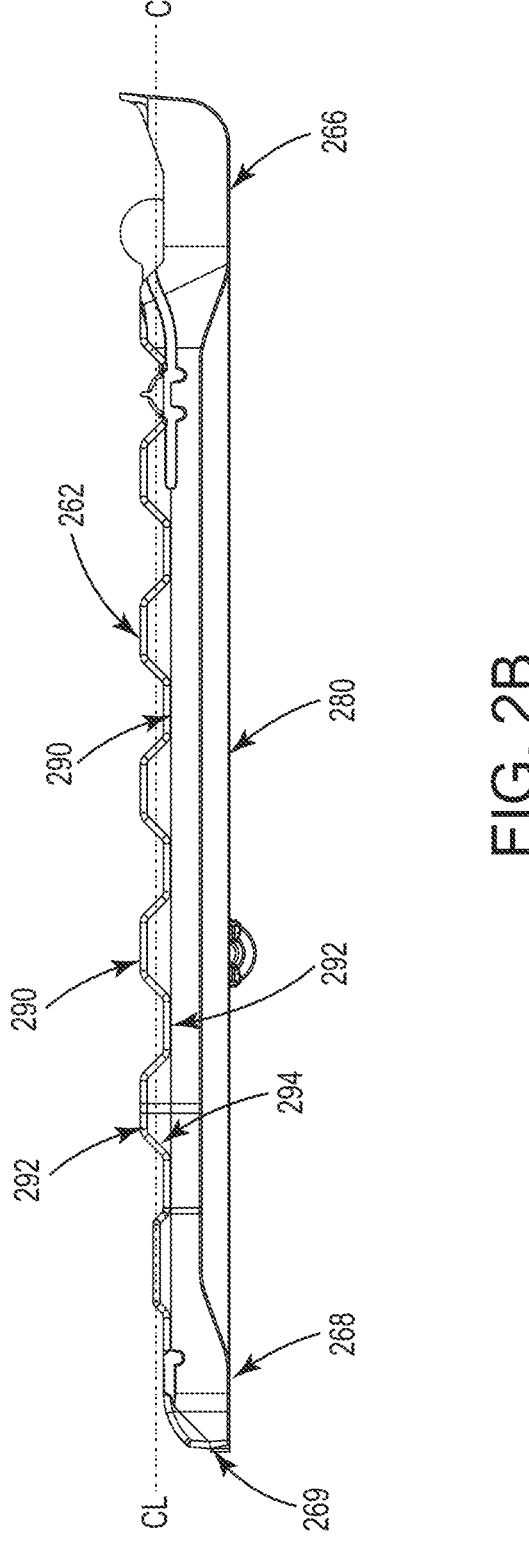
Figure 2C:
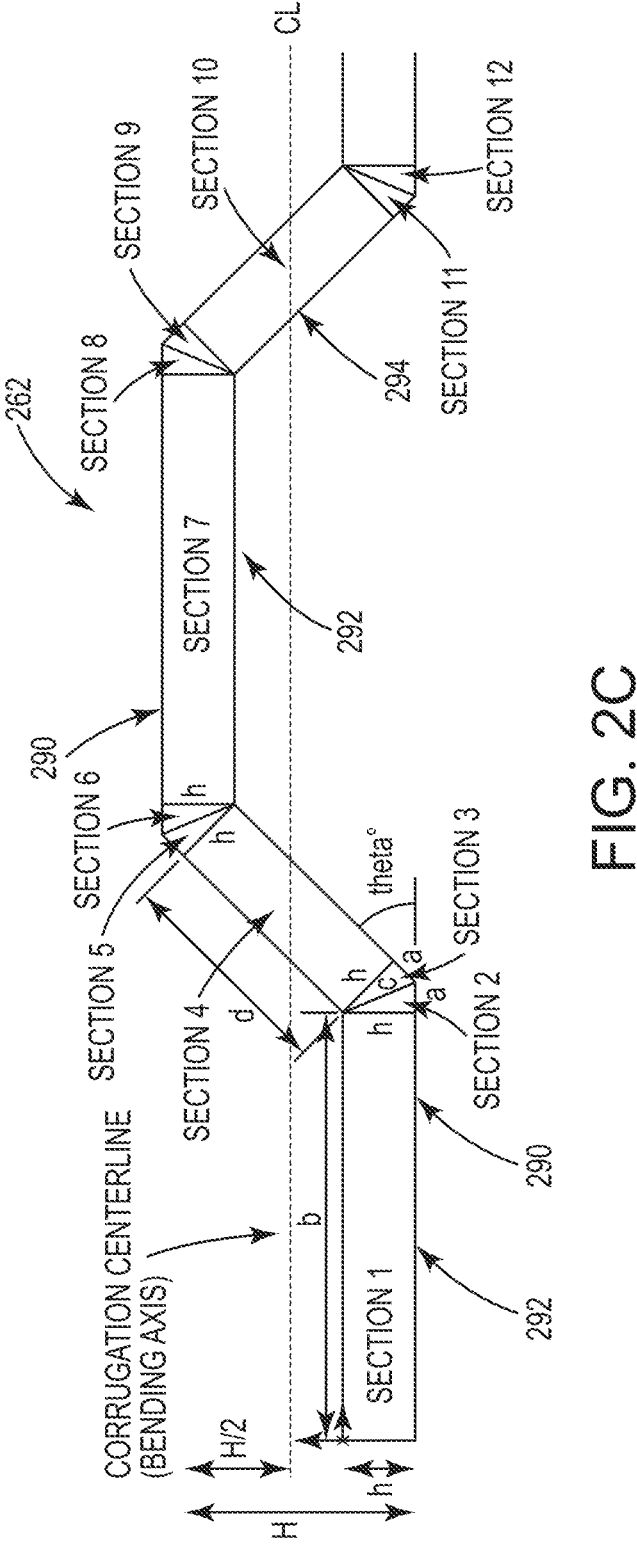

FIGS. 2A-2C illustrate an enlarged view of a support wall 262 of a support structure having a support ledge 264, according to an embodiment. The support wall 262 can be used in the support structure 160 and container 100 as discussed above with respect to FIGS. 1A-1D. The support ledge 264 can include a front portion 266 located toward the front (e.g., front 140 of FIGS. 1A-1D) of the shell (e.g., shell 110) and a rear portion 268 located toward the rear wall (e.g., rear wall 111 of the shell 110). The support ledge 264 can include a stop 269 that is engageable with the semiconductor substrate or tray (e.g., semiconductor substrate or tray 130) to limit insertion of the semiconductor substrate or tray into the interior space (e.g., interior space 120) in the Y-direction through the front opening (e.g., front opening 142). The support ledge 264 can further include a horizontal ledge portion 280 and a vertical ledge portion 282 extending upwardly from the horizontal ledge portion 280. The horizontal ledge portions 280 can be ribs extending perpendicularly from the support wall 262 for supporting the plurality of substrates or trays. The vertical ledge portion 282 can be a part of the support wall 262 forming the corrugation portions (as discussed herein) or a part of the horizontal ledge portion 280.

In an embodiment, the support wall 262 of the support structure (e.g., support structure 160) can include or be formed with a plurality of corrugation portions 290 provided along opposite sides of a centerline CL that is along a vertical plane at a center of the support wall 262. It is understood that the plurality of corrugation portions 290 includes at least 2 corrugation portions, e.g., each corrugation portion provided on opposite sides of the centerline CL, and can include any number of corrugation portions, for example, at least 10 corrugation portions or 20 corrugation portions. The number of corrugation portions is dependent on the application and weight requirement of the FOSB or FOUP and the weight of the substrates or trays that need to be supported. Each of the corrugation portions 290 can have inner and outer portions 292 that are parallel to the centerline CL and angled portions 294 connecting the inner and outer portions 292 that are provided along opposite sides of the centerline CL along the vertical plane at a center of the support wall 262. The inner and outer portions 292 can be spaced between about 1 and 20 mm from corresponding inner and outer portions 292 provided on opposite sides of the centerline CL and spaced about 1 to 10 mm from the centerline CL. In an embodiment, the inner and outer portions 292 can be spaced between about 5 and 10 mm from corresponding inner and outer portions 292 provided on opposite sides of the centerline CL and spaced about 2.5 to 5 mm from the centerline CL. The angled portions 294 connecting the corresponding inner and outer portions 292 are connected at angles $\theta$ that are about 30 to 90 degrees with respect to a plane parallel to the centerline CL. The thickness of the support wall 262 can be between about 1 mm and 5 mm, which can reduce the weight of the support wall 262 by about 20 to 40% over POR designs having a flat plate with the same or similar rigidity and strength, e.g., having a greater wall thickness, e.g., between about 5 to 10 mm to provide the rigidity and strength. For example, the thickness of the support wall 262 can be reduced from 3.5 mm to 2 mm and still maintain sufficient rigidity and strength to support the substrates or trays. As such, the corrugation portions 290 can be provided on inner and outer sides (with respect to the interior space) of the support wall 262 to provide rigidity and strength to the support wall 262 while reducing the overall weight of the semiconductor substrate carrying container (e.g., semiconductor substrate carrying container 100), as discussed below.

For example, the cross-sectional inertia of the corrugation portions 290 to determine the rigidity, e.g., resistance to bending, can be determined by the following equations:

$I_1=I_7, I_2=I_6=I_8=I_{12}, I_3=I_5=I_9=I_{11}, I_{14}=I_{10}$
P=Number of Corrugation Patterns $$I_1 = \frac{bh^3}{12} + bh \times \left(\frac{H}{2} - \frac{h}{2}\right)^2$$

$$I_2 = \frac{ah^3}{36} + \frac{ah}{2} \times \left(\frac{H}{2} + \frac{h}{2}\right)^2$$

$$I_3 = \frac{\frac{ah^3}{36} + \frac{ha^3}{36}}{2} + \frac{\frac{ah^3}{36} - \frac{ha^3}{36}}{2} \times \cos(2\theta) - \left(\frac{-a^2h^2}{72}\right) \times \sin(2\theta) +$$
$$\frac{ah}{2} \times \left(\frac{H}{2} - \sin\left(\tan^{-1}\left(\frac{\frac{h}{3}}{\frac{2a}{3}}\right) + \theta\right) \times \sqrt{\left(\frac{h}{3}\right)^2 + \left(\frac{2a}{3}\right)^2}\right)^2$$

$$I_4 = \frac{hd}{12} \times \left(h^2 \cos^2\theta + d^2 \sin^2\theta\right)$$

As such, the cross-sectional inertia can be generally defined as the following:

$$I_{Total}=P(I_1+I_2+I_3+I_4+I_5+I_6+I_7+I_8+I_9+I_{10}+I_{11}+I_{12})$$

In view of the above, it is understood that the corrugation portions 290 have a structure that is configured to leverage the parallel axis theorem to increase the cross-sectional inertia of the design of the corrugation portions 290 to provide superior rigidity and strength over POR designs having flat plate walls with the same or similar thickness. For example, for walls having the same thickness, e.g., 3 mm, the cross-sectional inertia of the support wall 262 having corrugation portions 290 were 5.5 to 16.5 times stronger than the flat plate design, in which the cross-sectional inertia can be dependent on the distance of the inner and outer portions 292 from the centerline CL. While the corrugation portions 290 are shown and discussed herein as having a trapezoidal geometric profile, it is appreciated that other geometric profiles can be used, for example, semicircular, rectangular, triangular, octagonal, or the like.

Moreover, it was surprisingly found that since the corrugation portions 290 are provided extending into the interior space (e.g., interior space 120), the horizontal ledge portions 280, e.g., ribs extending from the support wall 262, can have a width thinner than the ribs of the POR designs, for example, since the corrugation portions 290 provide vertical support to the horizontal ledge portions 280, e.g., the vertical ledge portions 282. As such, the horizontal ledge portions 280 of the support wall 262 are configured to support the substrates or trays loaded into the semiconductor substrate carrying container (e.g., semiconductor substrate carrying container 100) even at reduced thicknesses. For example, the thickness of the support ledges 264 can be reduced from between 2-2.5 mm to 1.5 mm while still maintaining the rigidity and strength to support the substrates or tray.

Referring back to FIGS. 2A-2C, the support wall 262 shows the plurality of corrugation portions 290 as vertical columns provided along a length of the support wall 262, e.g., the corrugation portion is provided as a columnar structure that is provided vertically from a top and bottom of the support wall 262. As such, the corresponding corrugation portions 290 provided on opposite sides of the centerline CL are provided such that concave portions of the corrugation portions 290 are facing the inner and outer sides of the support wall 262. While the corrugation portions 290 are discussed as being vertical columns, such disclosure is not intended to be limiting in scope. For example, in an embodiment, the corrugation portions 290 can be provided as horizontal rows along a width of the support wall 262, in which the corrugation portions are provided on opposite sides of the centerline of the support wall 262, e.g., the row is provided horizontally from the front end to the rear end. In another embodiment, the corrugation portions 290 can be provided as both vertical columns and horizontal rows such that the horizontal rows intersect with the vertical columns along a width and a length of the support wall 262, e.g., forming a checkerboard pattern.

FIGS. 3A-3D illustrate another embodiment of a semiconductor substrate carrying container 300 that can have the same or similar features as the semiconductor substrate carrying container 100 as illustrated in FIGS. 1A-1D. The container 300 includes a container shell 310 having a plurality of walls including a rear wall 311 at a rear of the container shell 310, a first side wall 312, a second side wall 314 opposite the first side wall 312, a top wall 316, and a bottom wall 318 opposite the top wall 316. The walls define an interior space 320 that is sized to be able to receive a plurality of semiconductor substrates or trays therein (not shown). The container 300 can further include a front 340 having a front opening 342 through which each one of the semiconductor substrates or trays is able to be removed from and inserted into the interior space 320.

In an embodiment, the container 300 can include support structure 360 that is provided in the interior space 320 for supporting the semiconductor substrates or trays therein. The support structure 360 can have any configuration that is sufficient to support the semiconductor substrates or trays and that permits the removal and insertion of the semiconductor substrates or trays through the front opening 342. In the illustrated example, the support structure 360 supports the semiconductor substrates or trays in a vertically stacked arrangement where the substrates or trays are vertically spaced from one another and each substrate or tray is oriented horizontally substantially parallel to the top wall 316 and the bottom wall 318.

In the embodiment, the support structure 360 can include a plurality of pairs of opposing walls 362 having support ledges (referred to generally using 364) within the interior space 320. The opposing walls 362 can be attached to the opposing side walls 312, 314, the rear wall 311, or to the top wall 316 and the bottom wall 318 of the container shell 310 or combinations thereof using any one of tabs, clips, rods, fasteners, grooves and projections, or the like. When viewing the container 300 from the top, like in FIG. 3C, each pair of opposing support ledges 364 may be referred to as having a right support ledge 364a and a left support ledge 364b. The right and left support ledges 364a, 364b forming each pair of support ledges are configured to support a respective one of the semiconductor substrates or trays in the interior space 320.

Figure 3A:
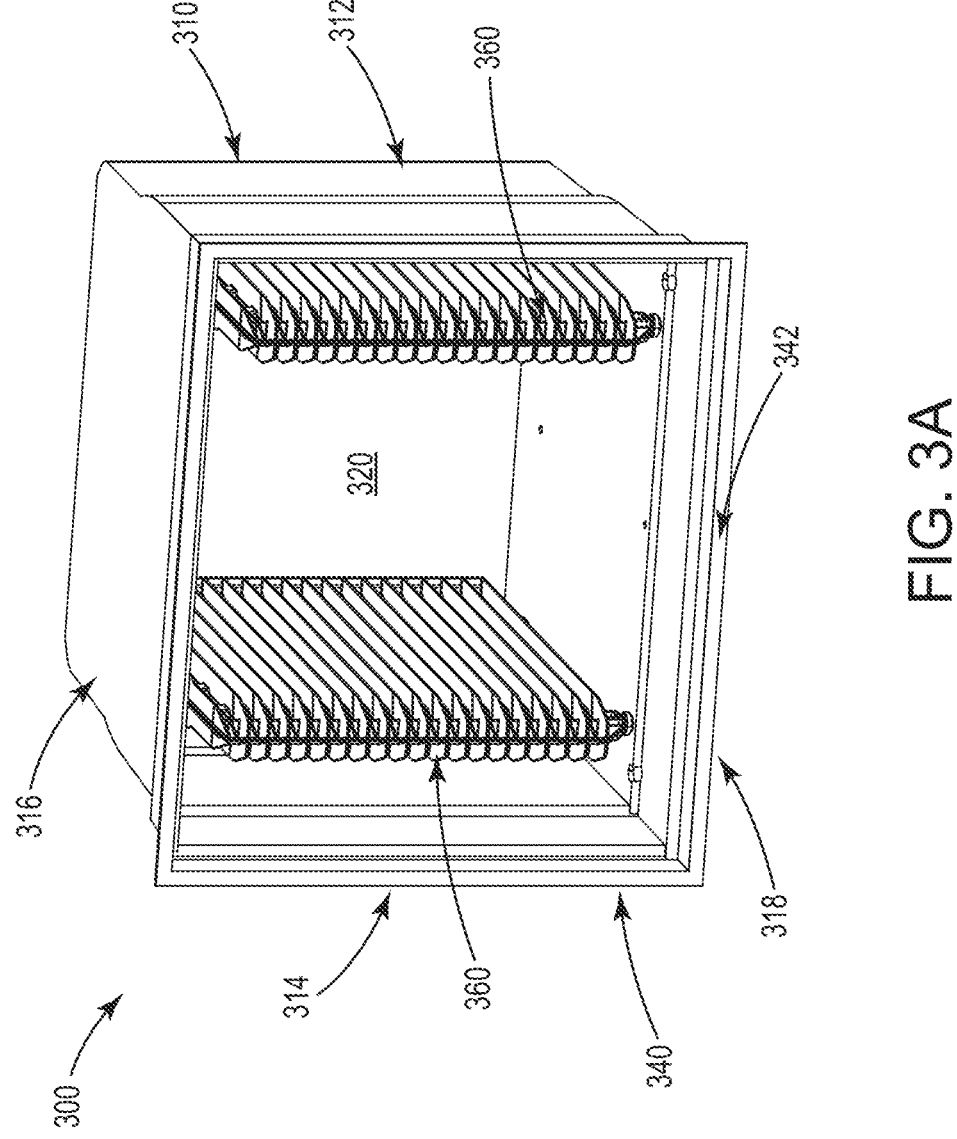
FIGS. 3A-3D illustrate a semiconductor substrate carrying container, according to another embodiment.
Figure 3B:
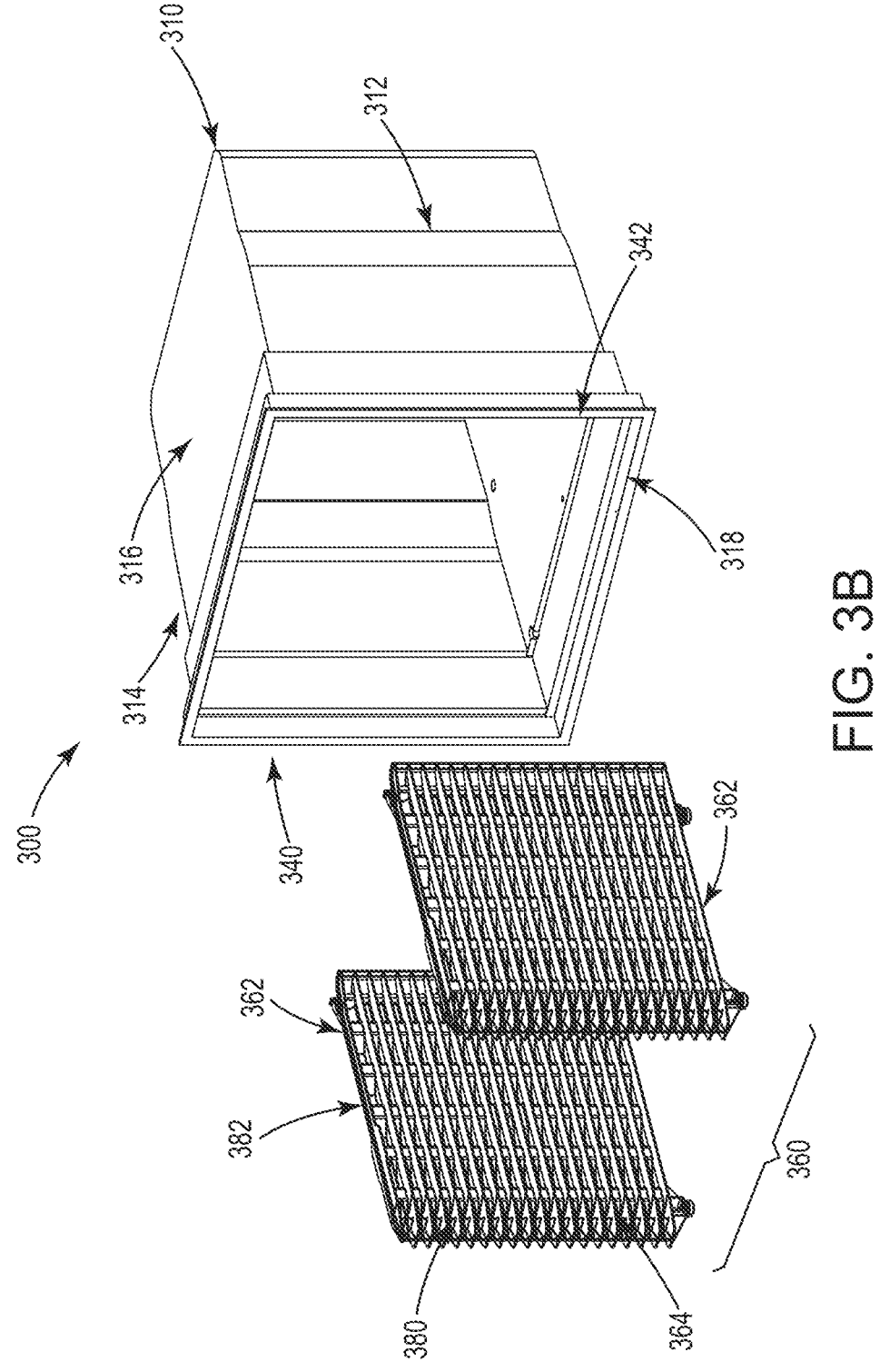
Figure 3C:
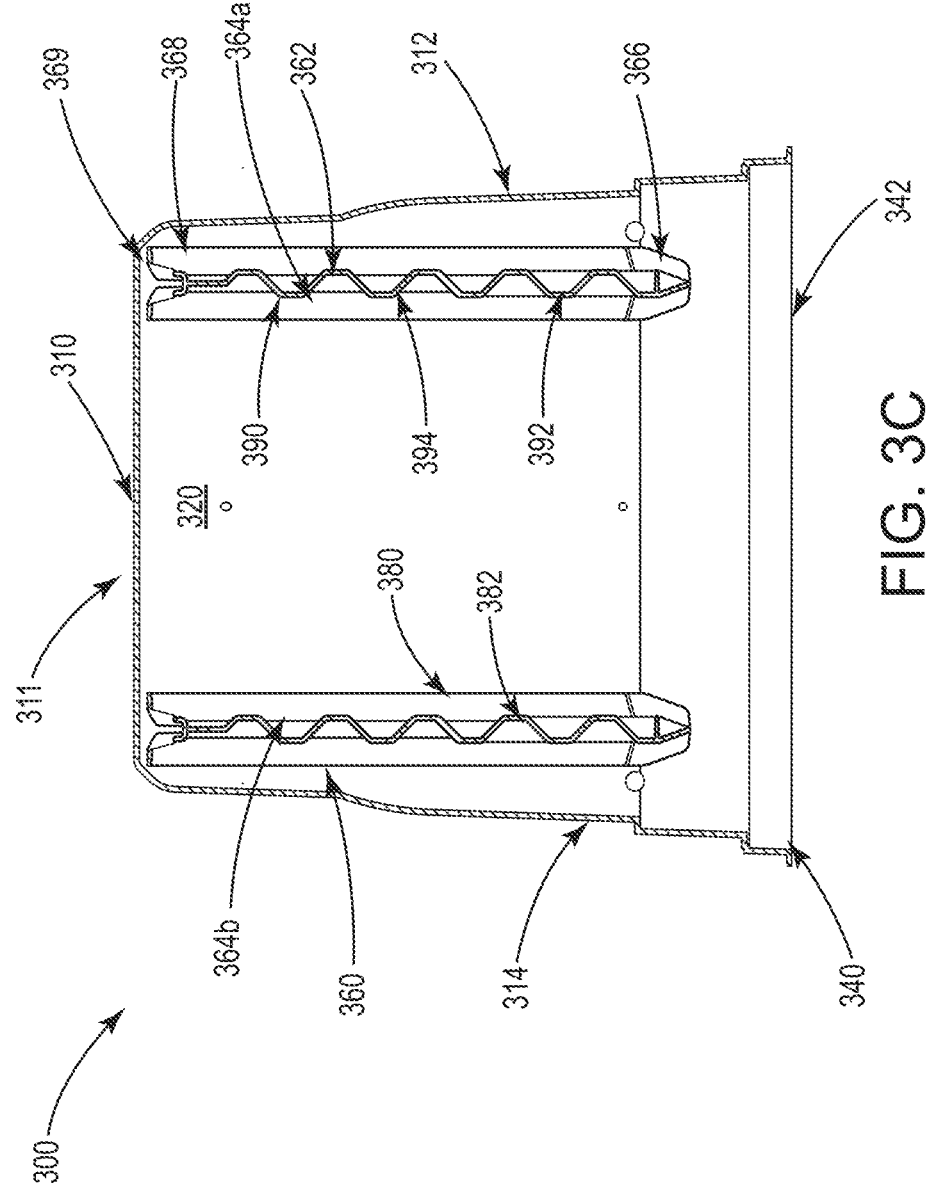
Figure 3D:
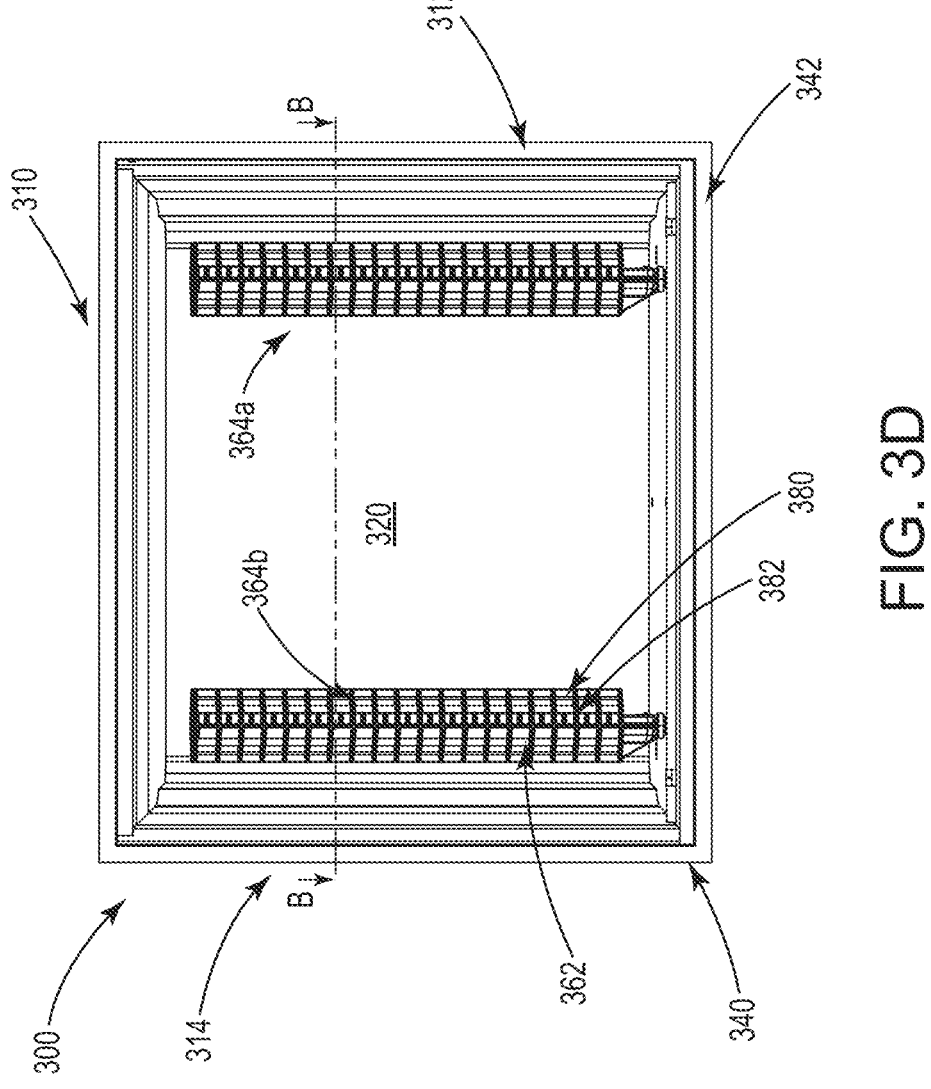

Referring to FIG. 3C, each of the right and left support ledges 364a, 364b can include a front portion 366 located toward the front 340 of the shell 310 and a rear portion 368 located nearer the rear wall 311 of the shell 310. The support ledges 364a, 364b are configured to position and support the substrate or trays in an X-Y plane.

Each support ledge 364a, 364b can further include a horizontal ledge portion 380 and a vertical ledge portion 382 extending upwardly from the horizontal ledge portion 380. The horizontal ledge portions 380 can be ribs extending perpendicularly from the support walls 362 for supporting the plurality of substrates or trays. The vertical ledge portion 382 can be a part of the support walls forming the corrugation portions (as discussed herein) or a part of the horizontal ledge portion 380.

In an embodiment, the wall 362 of the support structure 360 can include or be formed with a plurality of corrugation portions 390 provided along opposite sides of a centerline that is along a vertical plane at a center of the wall 362. It is understood that the plurality of corrugation portions 390 includes at least 2 corrugation portions, e.g., each corrugation portion provided on opposite sides of the centerline, and can include any number of corrugation portions, for example, at least 10 corrugation portions or 20 corrugation portions. The number of corrugation portions is dependent on the application and weight requirement of the FOSB or FOUP and the weight of the substrates or trays that need to be supported. Each of the corrugation portions 390 have a inner and outer portions 392 that are parallel to the centerline and angled portions 394 connecting the inner and outer portions 392 that are provided along opposite sides of the centerline along the vertical plane at a center of the wall 362. The inner and outer portions 392 can be spaced between about 1 and 20 mm from corresponding inner and outer portions 392 provided on opposite sides of the centerline and spaced about 1 to 10 mm from the centerline. In an embodiment, the inner and outer portions 392 can be spaced between about 5 and 10 mm from corresponding inner and outer portions 392 provided on opposite sides of the centerline and spaced about 2.5 to 5 mm from the centerline. The angled portions 394 connecting the corresponding inner and outer portions 392 are connected at angles that are about 30 to 90 degrees with respect to the centerline. The thickness of the wall 362 can be between about 1 mm and 5 mm, which can reduce the weight of the wall 362 by about 20 to 40% over POR designs having a flat plate with the same or similar rigidity and strength, e.g., by having a greater wall thickness. As such, the corrugation portions 390 can be provided on inner and outer sides (with respect to the interior space) of the wall 362 to provide rigidity and strength to the wall 362 while reducing the overall weight of the semiconductor substrate carrying container 300.

Referring back to FIG. 3C, the support ledge 364a can be provided on both sides of the corrugation portions 390, e.g., the inner and outer portion 392 can be provided on opposite sides of the wall 362. As such, the opposing walls 362 having the support ledges 364a, 364b can be formed, e.g., molded, as a single piece or component, e.g., can be used as either the right or left support wall, which can simply the manufacturing process of the semiconductor substrate carrying container. It is appreciated that such disclosure is not intended to limit the scope of the disclosure, and the support ledges can be formed on either side of the wall 362 to make left or right parts, accordingly.

Figure 4A:
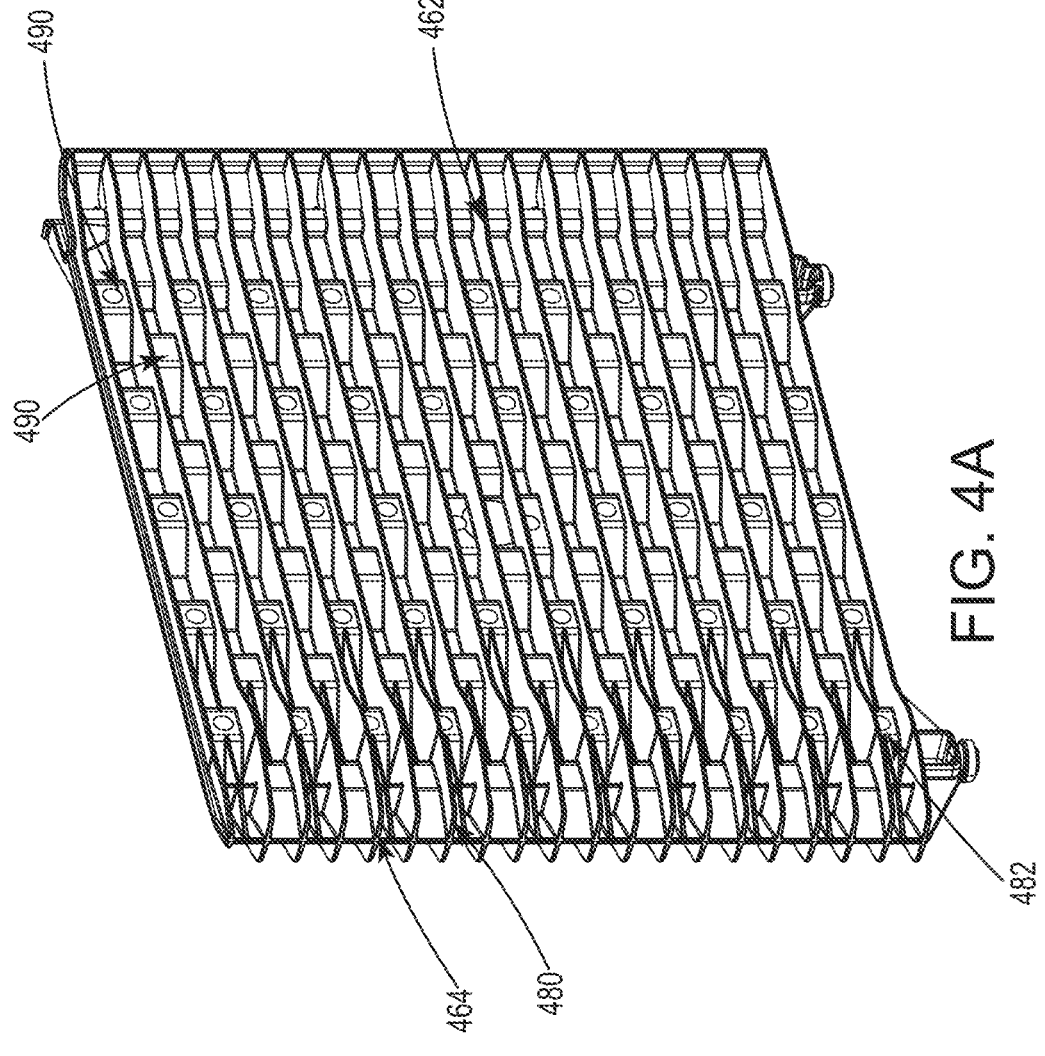
FIGS. 4A-4C illustrate a support wall used in a semiconductor substrate carrying container, according to another embodiment.
Figures 4B, 4C:
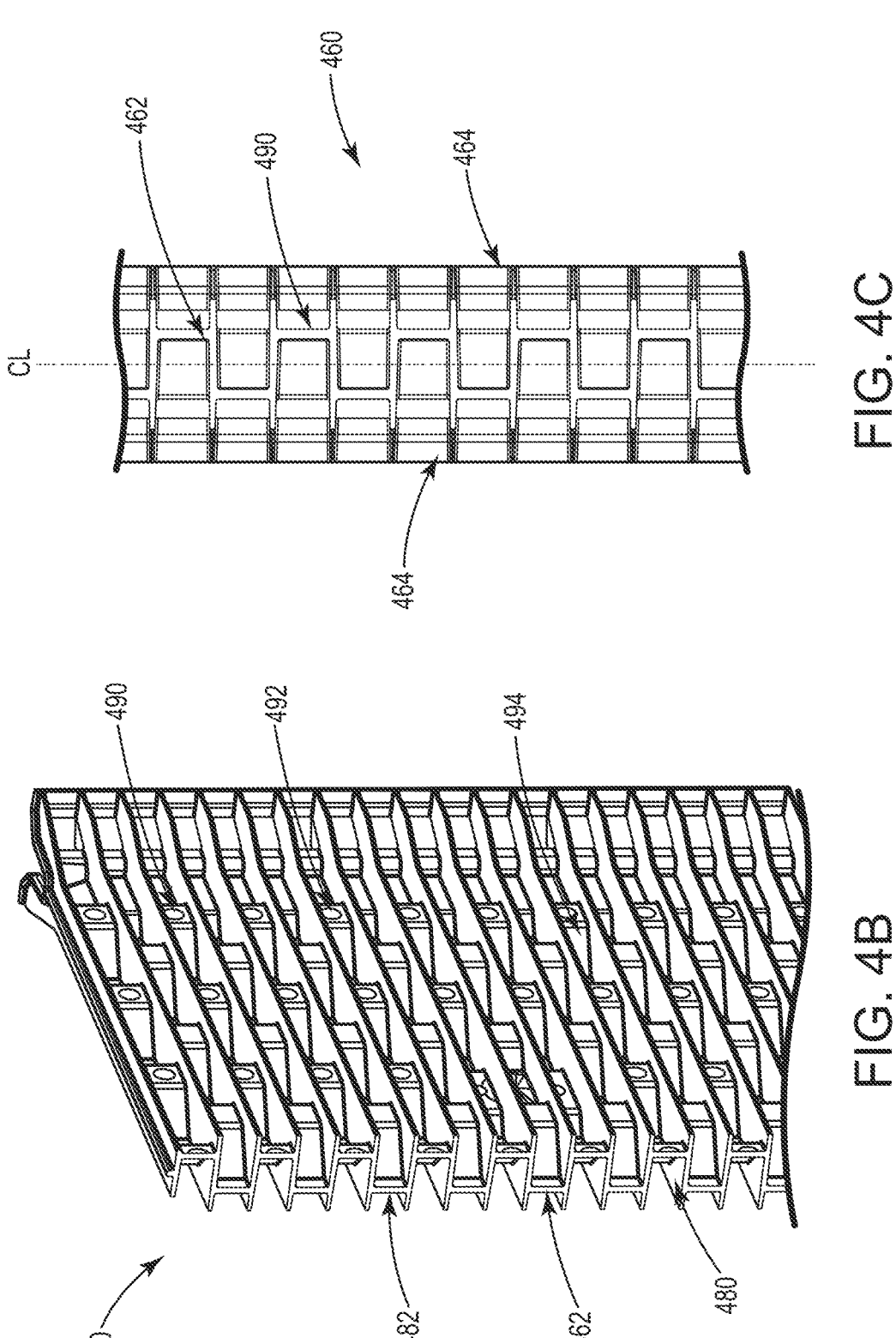

FIGS. 4A-4C illustrate a support wall 462 of a support structure 460, according to another embodiment, that can be used for any of the support structures 160, 360 as illustrated in FIGS. 1A-1D and 3A-3D and has similar features thereto. However, while support structures 160, 360 have a plurality of corrugation portions provided as vertical columns along a length of the center wall, the support wall 462 in this embodiment includes alternating horizontal or vertical corrugation portions which forms a checkerboard appearance in a plan view of a face of the support wall 462

In an embodiment, the support structure 460 includes the support wall 462 and support ledges 464 provided on opposite sides of the support wall 462. The support ledge 464 can further include a horizontal ledge portion 480 and a vertical ledge portion 882 extending upwardly from the horizontal ledge portion 480. The horizontal ledge portions 480 can be ribs extending from the support wall 462 for supporting the plurality of substrates or trays. The vertical ledge portion 482 can be a part of the support wall 462 forming the corrugation portions (as discussed herein) or part of the horizontal ledge portion 480.

Referring to FIGS. 4B-4C, in which FIG. 4B is a cross-sectional view of the support wall and FIG. 4C is a front view of the cross-sectional view of the support wall, the support wall 462 of the support structure 460 can include or be formed with a plurality of corrugation portions 490 provided along opposite sides of a centerline CL that is along a vertical plane at a center of the support wall 462. Not only do each of the corrugation portions 490, when viewed from a top direction of the support wall 462, have inner and outer portions 492 that are parallel to the centerline CL and angled portions 494 connecting the inner and outer portions 492 that are provided along opposite sides of the centerline CL along the vertical plane at a center of the support wall 462, as seen in FIG. 4C, the corrugation portions 490 can also alternate in a row-like manner, e.g., the adjacent columns can have the corrugation portions 490 provided in an alternating horizontal pattern. The inner and outer portions 492 can be spaced between about 1 and 20 mm from corresponding inner and outer portions 492 provided on opposite sides of the centerline CL and spaced about 1 to 10 mm from the centerline CL. In an embodiment, the inner and outer portions 492 can be spaced between about 5 and 10 mm from corresponding inner and outer portions 492 provided on opposite sides of the centerline CL and spaced about 2.5 to 5 mm from the centerline CL.

When viewing the support wall 462 from a top direction, the angled portions 494 connecting the corresponding inner and outer portions 492 are connected at angles θ that are about 30 to 90 degrees with respect to the centerline CL. The thickness of the support wall 462 can be between about 1 mm and 5 mm, which can reduce the weight of the support wall 462 by about 20 to 40% over POR designs having a flat plate with the same or similar rigidity and strength, e.g., by having a greater wall thickness. As such, the corrugation portions 490 are provided on opposite sides of the support wall 462 to provide rigidity and strength to the support wall 462 while reducing the overall weight of the semiconductor substrate carrying container (e.g., semiconductor substrate carrying container 100). While the support wall 462 has been discussed as having the alternating horizontal or vertical corrugation portions which forms a checkerboard appearance, such disclosure is not intended to be limiting in scope. Instead, such alternating corrugation portions can be used in any of the walls of the semiconductor substrate carrying container or components therein to provide rigidity and stiffness of the walls while minimizing weight or mass.

Figure 5A:
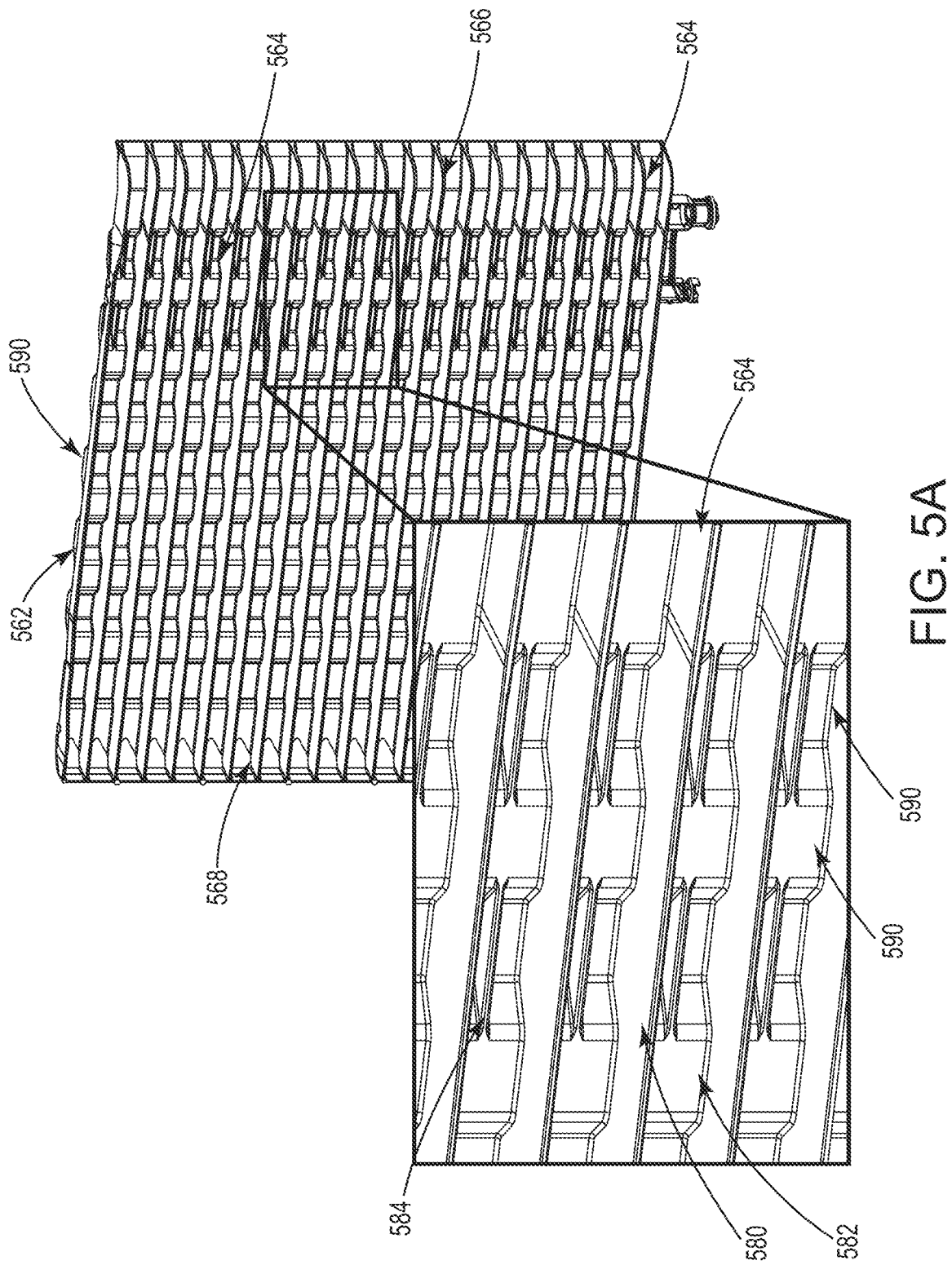
FIGS. 5A-5B illustrate a support wall used in a semiconductor substrate carrying container, according to another embodiment.

FIG. 5A illustrates a support wall 562 of a support structure 560 having a support ledge 564, according to yet another embodiment. The support wall 562 can be used in the support structure 160, 360 and container 100, 300 as discussed above with respect to FIGS. 1A-1D and 3A-3D and can have the same or similar features as the support walls discussed herein. The support ledge 564 can include a front portion 566 located toward the front (e.g., front 140) of the shell (e.g., shell 110) and a rear portion 568 located toward the rear wall (e.g., rear wall 111) of the shell. The support ledge 564 can further include a horizontal ledge portion 580 and a vertical ledge portion 582 extending upwardly from the horizontal ledge portion 580. The horizontal ledge portions 580 can be ribs extending perpendicularly from the support wall 562 for supporting the plurality of substrates or trays. The vertical ledge portion 582 can be a part of the support wall 562 forming the corrugation portions (as discussed herein) or a part of the horizontal ledge portion 580. In an embodiment, the support wall 562 of the support structure (e.g., support structure 160) can include a plurality of corrugation portions 590 provided along opposite sides of a centerline that is along a vertical plane at a center of the support wall 562.

As shown in FIG. 5A, concave portions of the corrugation portions 590 facing the interior space (e.g., interior space 120, 520) of the semiconductor substrate carrying container (e.g., semiconductor substrate carrying container 100, 300) can include positioning ribs 584. The positioning ribs 584 can span a width and a depth of the concave portion of the corrugation portion 590. The positioning ribs 584 can also have width that spans the distance between inner and outer portions of adjacent corrugation portions 590. The positioning ribs 584 can be placed in any number of the corrugation portions 590 and are configured to align the positioning of a substrate or tray into the interior space of the semiconductor substrate carrying container by providing a constant wall-like structure. In an embodiment, the positioning ribs

584 can be provided in at least one of the first two corrugation portions nearer the front portion 566 of the support ledge 564 along the entire length of the support wall 562. It is understood that not all of the corrugation portions 590 include the positioning ribs 584 at least because once the substrate or tray is inserted to a certain depth into the interior space, an aspect ratio of the substrate or tray is small enough such that the substrate or tray will be aligned for insertion onto the support ledge 564. While the corrugation portions 590 having the positioning ribs 584 have been discussed with respect to the support wall 562, such disclosure is not intended to be limiting in scope. Instead, the positioning ribs 584 can be used in any of the corrugation portions of any of the walls of the semiconductor substrate carrying container or components therein.

Figure 5B:
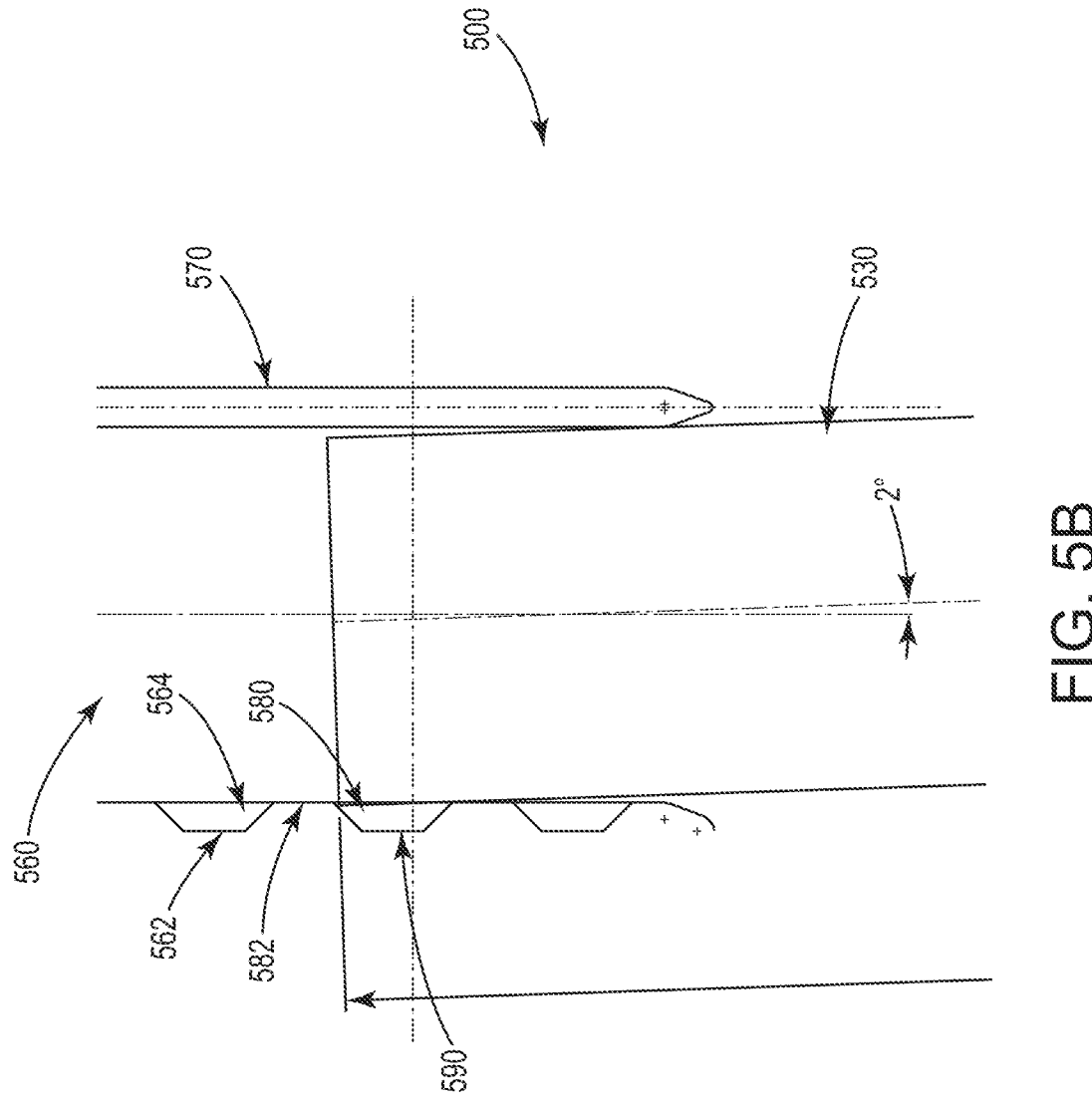

FIG. 5B shows a schematic representation of the insertion of a substrate or tray into a partial representation of a semiconductor substrate carrying container 500 that does not include the positioning ribs 584. The semiconductor substrate carrying container 500 can include a support structure 560 that includes an opposing support structure 570 and a support wall 562 that can include the same or similar features as the support structure and support wall, as discussed herein. The support wall 562 can include a support ledge 564 that can include a horizontal ledge portion 580 and a vertical ledge portion 582 extending upwardly from the horizontal ledge portion 580. The horizontal ledge portions 580 can be ribs extending from the support wall 562 for supporting the plurality of substrates or trays. The vertical ledge portion 582 can be a part of the support wall 562 forming the corrugation portions (as discussed herein) or a part of the horizontal ledge portion 580. In an embodiment, the support wall 562 of the support structure (e.g., support structure 160) can include a plurality of corrugation portions 590 provided along opposite sides of a centerline that is along a vertical plane at a center of the support wall 562.

As illustrated in FIG. 5B, when a substrate or tray 530 is being inserted onto a horizontal ledge portion 580 and the opposing support structure 570, if the substrate or tray 530 is inserted at an angle other than parallel, e.g., an offset angle of 2° to 10°, a corner of the substrate or tray 530 can get caught on an angled wall of the corrugation portion 590. Such deficiency can be overcome when the corrugation portions 590 include the positioning ribs 584, as discussed above with respect to FIG. 5A.

FIGS. 6A-6E illustrate an injection molding process for forming a support wall based on POR designs having a flat plate wall and a support wall (e.g., support wall 162, 262, 362, 462, 562) formed with corrugation portions (e.g., corrugation portions 190, 290, 390, 490, 590), as discussed herein. As discussed above, a substrate container (e.g., substrate container 100, 300) and components therein can be formed from one or more polymer materials including, but not limited to, injection-moldable polymer materials. The polymer material(s) can include, but are not limited to, one or more polyolefins, one or more polycarbonates, one or more thermoplastic polymers and the like. The substrate container can include a shell having a plurality of walls including a rear wall (e.g., rear wall 111, 311) at a rear of the container shell (e.g., shell 110, 310), a first side wall (e.g., side wall 112, 312), a second side wall (e.g., side wall 114, 314) opposite the first side wall, a top wall (e.g., top wall 116, 316) and a bottom wall (e.g., bottom wall 118, 318) opposite the top wall. The container (e.g., container 100, 300) can include a support structure (e.g., support structure 160, 360) that is provided in the interior space (e.g., interior space 120, 320) for supporting the semiconductor substrates or trays therein. The support structure (e.g., support structure 160, 360) can include a plurality of pairs of opposing support walls (e.g., support walls 162, 362) having support ledges (e.g., support ledges 164, 364) within the interior space.

Figures 6C, 6F:
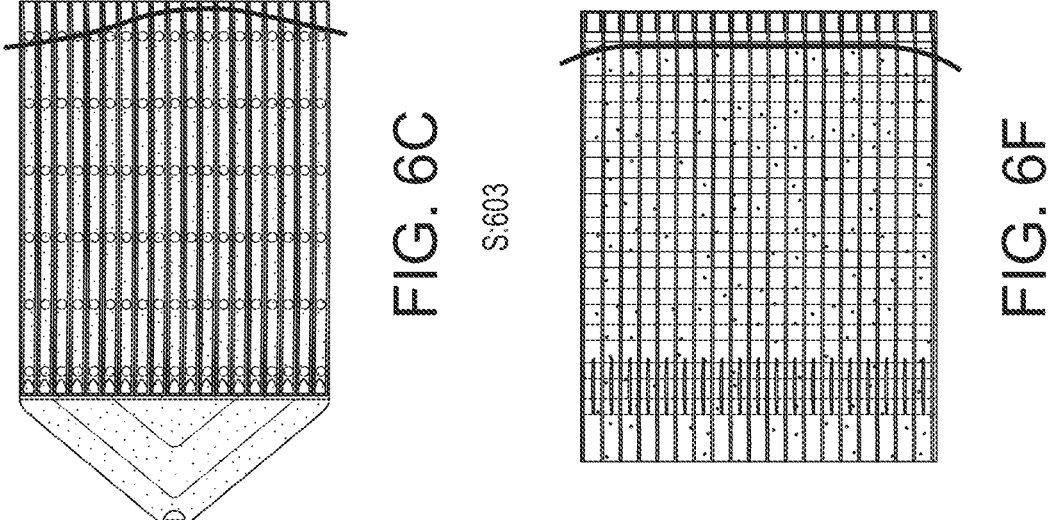

Referring to FIGS. 6A-6C, a method for forming a support structure for POR designs of the substrate carrying container having a flat plate wall is illustrated that includes the following.

At S:601 in FIG. 6A, resin is filled over or injected into a mold of the support wall for at least one of the walls for the support structure. The mold can include the flat plate wall and the support ledges extending from the flat plate wall for supporting the substrates or trays.

At S:602, as the resin is being filled or injected into the mold at a constant pressure, as illustrated in FIG. 6B, a flow of the resin can become non-uniform.

At S:603 in FIG. 6C, the non-uniformity of the flow of the resin is further apparent in which portions of the support wall are filled or formed before other portions of the support wall.

Without wishing to be bound by theory, it is understood that since the filling or injection of the resin is pressure dependent and the support ledges are thinner than the flat plate wall, the flow of the resin can vary along the length of the support wall, e.g., perpendicular to the injection direction, due to surface tension or the like.

On the other hand, referring to FIGS. 6D-6F, a method for forming a support structure for the substrate carrying container, as discussed herein, having a support wall formed with corrugation portions, is illustrated that includes the following.

At S:601 in FIG. 6D, resin is filled over or injected into a mold of the support wall for at least one of the walls for the support structure. The mold can include the support wall and the support ledges extending from the support wall for supporting the substrates or trays.

At S:602, as the resin is being filled or injected into the mold at a constant pressure, as illustrated in FIG. 6E, a flow of the resin is uniform or substantially uniform, e.g., not greater than 10% offset from vertical, across the length of the support wall, e.g., perpendicular to the injection direction.

At S:603 in FIG. 6F, the uniformity of the flow of the resin is maintained in which a majority of the portions of the support wall are filled or formed at about the same fill or injection rate. That is, the resin has a flow rate for forming the support wall that is about the same flow rate for forming the support ledge extending from the support wall, e.g., has a uniform flow front such that the flow rate of the resin is about the same for forming the wall and the support ledge.

Without wishing to be bound by theory, it is understood that while the filling or injection of the resin is pressure dependent and the support ledges are thinner than the support wall, it was unexpectedly found that since the mold includes the corrugation portions, e.g., vertical columns extending along the length of the support wall, the corrugation portions slowed the flow of the resin across the length of the support wall. For example, the corrugation portions increased the linear distance the resin must flow as the resin flows in the injection direction. It is understood that the slowing of the resin flow in the injection direction allows the resin to flow through the mold of the thinner support ledges at about the same flow rate as the flow of resin forming the support wall. As such, a uniform flow front is maintained while molding the support wall. As such, an improvement in moldability of the support wall is provided which reduces internal stress and warp in the final product. For example, since the flow of resin is more uniform, the support wall can be cooled at the same or similar rates which reduces warp and internal stresses of the support wall.

Moreover, such a molding process to form the support wall allows the molding of the support wall as a single molded component. As such, not only does a single molded component have a lower mass or weight than POR designs of the component having two flat plate walls with the same or similar rigidity and strength, the single molded component allows the manufacturing of the support wall that maintains the interface points for the semiconductor substrate carrying container, e.g., according to the Semiconductor Equipment and Materials International (SEMI) standards.

As such, the embodiments as disclosed herein can have improved features over POR designs by using a support wall of the support structure having or formed with corrugation portions. For example, the support structure can have a reduced mass as compared to POR designs and meet the structural rigidity and stiffness needed for supporting the substrates or trays, e.g., the mass is reduced by about 30-65% over prior process or product of record (POR) designs. Additionally, since the wall can include the corrugation portions provided on both sides of the support wall, both sides of the support wall can be used to control lateral positioning of the substrate or tray with a single molded piece, while the POR designs can include multiple components that each include a flat plate wall that are combined together. That is, the support wall with corrugation portions can allow the substrate support to be designed with wall sections having a reduced thickness to reduce mass while still retaining strength characteristics similar to simpler, thick flat plate walls of the POR designs.

In other words, the support wall having the corrugation portions have at least the following benefits:

Reduce mass, which reduces the overall mass of the semiconductor substrate carrying containers.

Meet structural rigidity needed to support the weight of semiconductor substrates and trays.

Maintain tray plane dimensions and maintain existing substrate interface points while having sufficient stiffness to overcome molded-in stress and control warp.

Improved manufacturability by reducing warp and molded-in stress by allowing the wall to cool at the same or similar rate.

Additionally, it was also surprisingly found that the support wall having the corrugation portions had lower internal stress and warp that was more uniform than the POR designs of the support wall, e.g., having the flat plate wall.

Figure 7A:
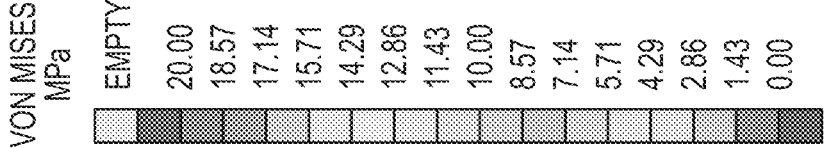
FIGS. 7A-7B illustrate comparative features of a support structure, according to an embodiment.
Figure 7A:
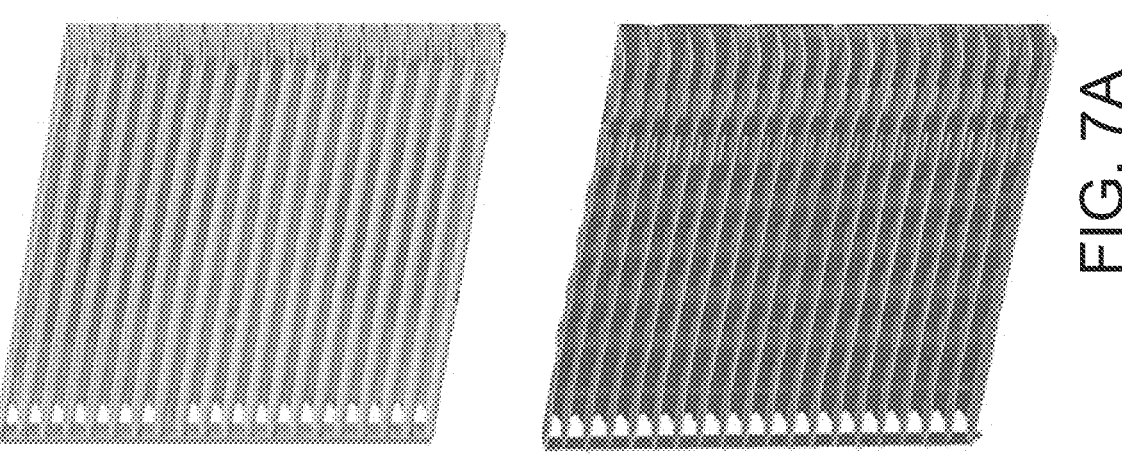
Figure 7B:
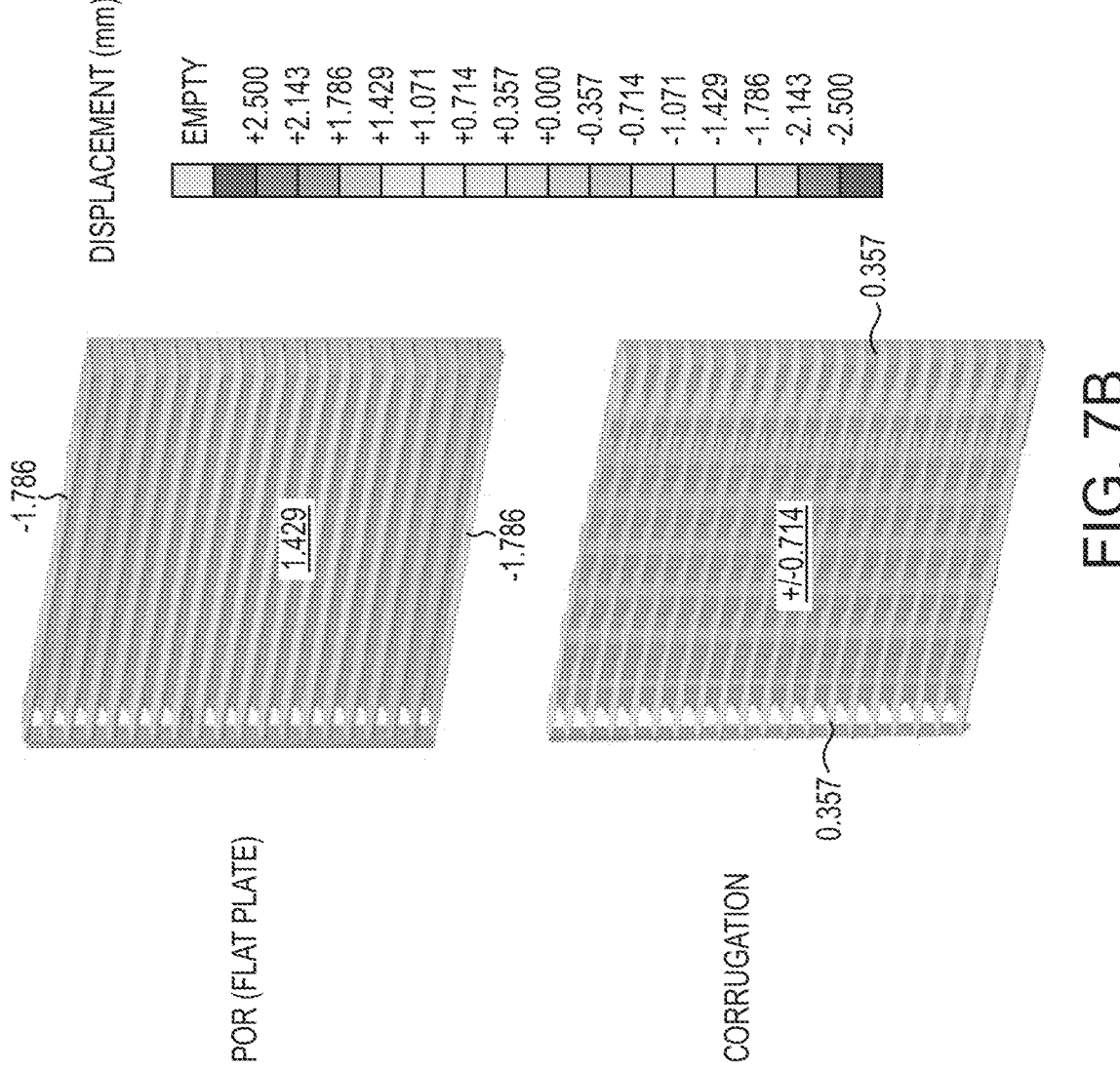

For example, the improvements of internal stress and warp are illustrated in FIGS. 7A and 7B. As seen in FIG. 7A, the internal stress of the support wall having the corrugation portions is between 0 and 1.43 MPa, whereas, the internal stress of the POR support wall with a flat plate is between 4.29 and 8.57 MPa. Similarly, as seen in FIG. 7B, the warp (or displacement) of the support wall having the corrugation portions is uniformly distributed to be between −0.714 mm and 0.357 mm, whereas the warp of the POR support wall with the flat plate is between −1.786 mm and 1.429 mm which is not uniformly distributed across the support wall.

As such, the resulting support wall having or formed with the corrugation portions formed by the molding process, as discussed above, were surprisingly found to have lower internal stresses and warp and was more inform as compared with the flat plate used in the POR designs of the support wall, when the same gate and cooling system is used.

While the wall having or formed with the corrugation portions have been discussed herein with respect to the walls of the support structure, such disclosure is not intended to be limiting in scope. For example, in an embodiment, the rear wall of the semiconductor substrate carrying container can include or be formed with the corrugation portions. In another embodiment, the support ledges can be formed with the corrugation portions, in which the corrugation portions are directed towards the bottom wall, such that the substrate interface points, e.g., plane and width, can be maintained. As such, it is understood that the corrugation portions can be implemented on any structure of the semiconductor substrate carrying container that needs a reduced mass, e.g., by reduced thickness of the part, but maintain structural ridigity and stiffness, as compared with POR designs.

Aspects

Any of aspects 1-10 can be combined with any of aspects 11-15 and aspect 16 or vice-versa.

Aspect 1. A semiconductor substrate carrying container, comprising a container shell having a plurality of walls, a front, and a rear, the plurality of walls defining an interior space that is sized to be able to receive a plurality of semiconductor substrates or trays therein; and a support structure configured to receive the plurality of semiconductor substrates or trays, wherein the container shell defines an opening configured to allow a semiconductor substrate or tray of the plurality of semiconductor substrates and trays to be inserted into or removed from the interior space, wherein the support structure comprises at least one support wall that is formed by a plurality of corrugation portions provided along opposite sides of a centerline along a vertical plane at a center of the at least one support wall.

Aspect 2. The semiconductor substrate carrying container of Aspect 1, wherein the support structure includes opposing support walls, and further comprising a plurality of pairs of opposing support ledges within the interior space and attached to the opposing support walls of the support structure, each pair of opposing support ledges is configured to support the semiconductor substrate or tray in the interior space.

Aspect 3. The semiconductor substrate carrying container of Aspect 2, wherein each support ledge comprises a front portion and a rear portion, and at least one of the rear portions of the opposing support ledges of each pair includes a stop that is engageable with the semiconductor substrate or tray to limit insertion of the semiconductor substrate or tray into the interior space.

Aspect 4. The semiconductor substrate carrying container of Aspect 2, wherein each support ledge comprises: a horizontal ledge portion and a vertical ledge portion extending upwardly from the horizontal ledge portion.

Aspect 5. The semiconductor substrate carrying container of any of Aspects 1-4, wherein the at least one support wall comprises a plurality of thin ribs configured to align the plurality of semiconductor substrates or trays.

Aspect 6. The semiconductor substrate carrying container of any of Aspects 1-5, wherein the plurality of corrugation portions is provided as vertical columns along a length of the at least one support wall.

Aspect 7. The semiconductor substrate carrying container of any of Aspects 1-6, wherein the plurality of corrugation portions is provided as horizontal rows along a width of the at least one support wall.

Aspect 8. The semiconductor substrate carrying container of any of Aspects 1-7, wherein the plurality of corrugation portions is provided as horizontal rows that intersect with vertical columns along a width and a length of the at least one support wall.

Aspect 9. The semiconductor substrate carrying container of Aspect 2, wherein the opposing support walls further include a second plurality of support ledges attached to the opposing support walls provided on opposite sides of the plurality of support ledges provided on the support walls.

Aspect 10. The semiconductor substrate carrying container of any of Aspects 1-9, wherein the semiconductor substrate carrying container comprises a front opening unified pod.

Aspect 11. A front opening shipping box or unified pod, comprising a shell having a front opening and an interior space; a support structure comprising a plurality of pairs of opposing support ledges within the interior space and attached to the shell, each pair of opposing support ledges is configured to support a semiconductor substrate or tray in the interior space, wherein at least one of the opposing support ledges includes a support wall having a plurality of corrugation portions provided along opposite sides of a centerline along a vertical plane at a center of the support wall.

Aspect 12. The front opening shipping box or unified pod of Aspect 11, wherein the semiconductor substrates comprise wafers or flat panels.

Aspect 13. The front opening shipping box or unified pod of any of Aspects 11-12, wherein each support ledge comprises a front portion and a rear portion, and at least one of the rear portions of the opposing support ledges of each pair includes a stop that is engageable with the semiconductor substrate or tray to limit insertion of the semiconductor substrate or tray into the interior space.

Aspect 14. The front opening shipping box or unified pod of any of Aspects 11-13, wherein each support ledge comprises: a horizontal ledge portion and a vertical ledge portion extending upwardly from the horizontal ledge portion.

Aspect 15. The front opening shipping box or unified pod of any of Aspects 11-14, wherein the plurality of corrugation portions is provided as vertical columns along a length of the support wall, as horizontal rows along a width of the support wall, or a combination thereof.

Aspect 16. A method for manufacturing a substrate carrying container comprising the steps filling a resin over a mold for at least one wall of a plurality of walls for a container shell for the substrate carrying container such that a flow of the resin has a flow rate for forming the wall that is about a same flow rate for forming a support ledge extending from the wall, wherein the mold for the at least one wall includes a plurality of corrugation portions provided along opposite sides of a centerline along a vertical plane at a center of the at least one wall, wherein at least one corrugation portion of the plurality of corrugation portions creates a uniform flow front such that the flow rate of the resin is about the same for forming the wall and the support ledge.

The examples disclosed in this application are to be considered in all respects as illustrative and not limitative. The scope of the invention is indicated by the appended claims rather than by the foregoing description; and all changes which come within the meaning and range of equivalency of the claims are intended to be embraced therein.

The invention claimed is:

1. A semiconductor substrate carrying container, comprising:

a container shell having a plurality of walls, a front, and a rear, the plurality of walls defining an interior space that is sized to be able to receive a plurality of semiconductor substrates or trays therein; and a support structure configured to receive the plurality of semiconductor substrates or trays, wherein the container shell defines an opening configured to allow a semiconductor substrate or tray of the plurality of semiconductor substrates and trays to be inserted into or removed from the interior space, wherein the support structure comprises at least one support wall that is formed with a plurality of corrugation portions provided along opposite sides of a centerline along a vertical plane at a center of the at least one support wall.

2. The semiconductor substrate carrying container of claim 1, wherein the support structure includes opposing support walls, and further comprising a plurality of pairs of opposing support ledges within the interior space and attached to the opposing support walls of the support structure, each pair of opposing support ledges is configured to support the semiconductor substrate or tray in the interior space.

3. The semiconductor substrate carrying container of claim 2, wherein each support ledge comprises a front portion and a rear portion, and at least one of the rear portions of the opposing support ledges of each pair includes a stop that is engageable with the semiconductor substrate or tray to limit insertion of the semiconductor substrate or tray into the interior space.

4. The semiconductor substrate carrying container of claim 2, wherein each support ledge comprises: a horizontal ledge portion and a vertical ledge portion extending upwardly from the horizontal ledge portion.

5. The semiconductor substrate carrying container of claim 1, wherein the at least one support wall comprises a plurality of thin ribs configured to align the plurality of semiconductor substrates or trays.

6. The semiconductor substrate carrying container of claim 1, wherein the plurality of corrugation portions is provided as vertical columns along a length of the at least one support wall.

7. The semiconductor substrate carrying container of claim 1, wherein the plurality of corrugation portions is provided as horizontal rows along a width of the at least one support wall.

8. The semiconductor substrate carrying container of claim 1, wherein the plurality of corrugation portions is provided as horizontal rows that intersect with vertical columns along a width and a length of the at least one support wall.

9. The semiconductor substrate carrying container of claim 2, wherein the opposing support walls further include a second plurality of support ledges attached to the opposing support walls provided on opposite sides of the plurality of support ledges provided on the support walls.

10. The semiconductor substrate carrying container of claim 1, wherein the semiconductor substrate carrying container comprises a front opening unified pod.

11. A front opening shipping box or unified pod, comprising:

a shell having a front opening and an interior space;

a support structure comprising a plurality of pairs of opposing support ledges within the interior space and attached to the shell, each pair of opposing support ledges is configured to support a semiconductor substrate or tray in the interior space, wherein at least one of the opposing support ledges includes a support wall having a plurality of corrugation portions provided along opposite sides of a centerline along a vertical plane at a center of the support wall.

12. The front opening shipping box or unified pod of claim 11, wherein the semiconductor substrates comprise wafers or flat panels.

13. The front opening shipping box or unified pod of claim 11, wherein each support ledge comprises a front portion and a rear portion, and at least one of the rear portions of the opposing support ledges of each pair includes a stop that is engageable with the semiconductor substrate or tray to limit insertion of the semiconductor substrate or tray into the interior space.

14. The front opening shipping box or unified pod of claim 11, wherein each support ledge comprises: a horizontal ledge portion and a vertical ledge portion extending upwardly from the horizontal ledge portion.

15. The front opening shipping box or unified pod of claim 11, wherein the plurality of corrugation portions is provided as vertical columns along a length of the support wall, as horizontal rows along a width of the support wall, or a combination thereof.

* * * * *